US012622158B2

(12) United States Patent
Nishizaki et al.

(10) Patent No.: US 12,622,158 B2
(45) Date of Patent: May 5, 2026

(54) DISPLAY PANEL IN WHICH AN INORGANIC LAYER REPLACES A TYPICAL ORGANIC LAYER IN AN ENCAPSULATION LAYER

(71) Applicant: SAMSUNG DISPLAY CO., LTD., Yongin-si (KR)

(72) Inventors: Shogo Nishizaki, Yongin-si (KR); Jaehyun Kim, Yongin-si (KR); Young Seo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 327 days.

(21) Appl. No.: 18/346,158

(22) Filed: Jun. 30, 2023

(65) Prior Publication Data

US 2024/0008346 A1     Jan. 4, 2024

(30) Foreign Application Priority Data

Jul. 1, 2022     (KR) ........................ 10-2022-0081361

(51) Int. Cl.
| | |
|---|---|
| *H10K 59/80* | (2023.01) |
| *H10K 59/122* | (2023.01) |
| *H10K 59/82* | (2023.01) |
| *H10K 77/10* | (2023.01) |
| *H10K 102/00* | (2023.01) |

(52) U.S. Cl.
CPC ....... *H10K 59/8731* (2023.02); *H10K 59/122* (2023.02); *H10K 59/82* (2023.02); *H10K 77/111* (2023.02); *H10K 2102/351* (2023.02)

(58) Field of Classification Search
CPC .. H10K 59/8731; H10K 59/122; H10K 59/82; H10K 2102/351; H10K 59/873
See application file for complete search history.

(56) References Cited

U.S. PATENT DOCUMENTS

| | | | |
|---|---|---|---|
| 9,196,863 B2 | 11/2015 | Sin et al. | |
| 2003/0203210 A1 | 10/2003 | Graff et al. | |
| 2011/0100458 A1 | 5/2011 | Kang et al. | |
| 2013/0069165 A1 | 3/2013 | Choi et al. | |
| 2014/0217371 A1* | 8/2014 | Kim ..................... | H10K 59/122 |
| | | | 438/26 |
| 2017/0263886 A1* | 9/2017 | Oh ......................... | H10D 86/60 |
| 2020/0127233 A1* | 4/2020 | Sung .................. | H10K 59/8731 |
| 2021/0066661 A1* | 3/2021 | Kim ..................... | H10K 59/122 |

(Continued)

FOREIGN PATENT DOCUMENTS

| | | |
|---|---|---|
| KR | 10-2014-0120641 | 10/2014 |
| KR | 10-2017-0105155 A | 9/2017 |

(Continued)

*Primary Examiner* — Tracie Y Green
(74) *Attorney, Agent, or Firm* — F. CHAU & ASSOCIATES, LLC

(57)     ABSTRACT

A display panel includes a base layer, a circuit layer disposed on the base layer, a light emitting element layer disposed on the circuit layer, and an encapsulation layer disposed on the light emitting element layer. The encapsulation layer includes a first inorganic layer that includes a lower layer and an upper layer disposed on the lower layer, and a second inorganic layer disposed on the first inorganic layer. The lower layer includes a barrier layer that includes a silicon oxide, and the upper layer includes a silicon oxycarbide.

17 Claims, 11 Drawing Sheets

(56)      References Cited

U.S. PATENT DOCUMENTS

| | | | |
|---|---|---|---|
| 2021/0359274 A1 | 11/2021 | Kim et al. | |
| 2022/0077434 A1 | 3/2022 | Seo et al. | |
| 2022/0208904 A1* | 6/2022 | Lee .................. | H10K 59/80515 |

FOREIGN PATENT DOCUMENTS

| | | |
|---|---|---|
| KR | 10-2020-0026381 A | 3/2020 |
| KR | 10-2102913 | 4/2020 |
| KR | 10-2022-0031837 | 3/2022 |
| KR | 10-2022-0092222 A | 7/2022 |

* cited by examiner

FIG. 5

DISPLAY PANEL IN WHICH AN INORGANIC LAYER REPLACES A TYPICAL ORGANIC LAYER IN AN ENCAPSULATION LAYER

CROSS-REFERENCE TO RELATED APPLICATIONS

This U.S. non-provisional patent application claims priority under 35 U.S.C. § 119 from Korean Patent Application No. 10-2022-0081361, filed on Jul. 1, 2022 in the Korean Intellectual Property Office, the contents of which are herein incorporated by reference in their entirety.

TECHNICAL FIELD

Embodiments of the present disclosure herein are directed to a display panel, and more particularly, to a display panel that includes an encapsulation layer that covers a light emitting element.

DISCUSSION OF THE RELATED ART

An electronic device includes an active region activated by an electrical signal. An electronic device senses pressure applied from the outside through the active region, and at the same time, displays various images that provide information to a user.

An electronic device includes a light emitting element that uses one of an organic light emitting material, a quantum dot light emitting material, etc. Such a light emitting element is vulnerable to oxygen and moisture, and when oxygen and moisture penetrate from the outside, a variety of defects may occur.

SUMMARY

Embodiments of the present disclosure provide a display panel in which an inorganic layer replaces a typical organic layer in an encapsulation layer, so that the encapsulation layer has increased barrier and planarization properties.

An embodiment of the inventive concept provides a display panel that includes a base layer, a circuit layer disposed on the base layer, a light emitting element layer disposed on the circuit layer, and an encapsulation layer disposed on the light emitting element layer. The encapsulation layer includes a first inorganic layer that includes a lower layer and an upper layer disposed on the lower layer, and a second inorganic layer disposed on the first inorganic layer. The lower layer includes a barrier layer that includes a silicon oxide, and the upper layer includes a silicon oxycarbide.

In an embodiment, the lower layer may further include a planarization layer that includes a silicon oxycarbide. The lower layer includes a laminate structure of two or more layers in which the barrier layer and the planarization layer are alternately laminated, and the upper layer is in contact with a barrier layer.

In an embodiment, in the planarization layer, based on a total content, a content of silicon may be approximately 20 at % to approximately 40 at %, a content of oxygen may be approximately 50 at % to approximately 70 at %, and a content of carbon may be greater than 0 at % to approximately 30 at %.

In an embodiment, in the planarization layer, based on the total content, the content of carbon may be greater than 0 at % to approximately 15 at %.

In an embodiment, a thickness of the barrier layer may be approximately 10 nm to approximately 500 nm, and a thickness of the planarization layer may be approximately 10 nm to approximately 1 μm.

In an embodiment, a thickness of the lower layer may be approximately 10 nm to approximately 2 μm.

In an embodiment, the upper layer may have a single-layered structure.

In an embodiment, in the upper layer, based on the total content, a content of silicon may be approximately 20 at % to approximately 40 at %, a content of oxygen may be approximately 50 at % to approximately 70 at %, and a content of carbon may be greater than 0 at % to approximately 30 at %.

In an embodiment, in the upper layer, based on the total content, the content of carbon may be greater than 0 at % to approximately 15 at %.

In an embodiment, a thickness of the upper layer may be approximately 3 μm to approximately 10 μm.

In an embodiment, the light emitting element layer may include a pixel definition film and a light emitting element that includes a functional layer disposed in an opening formed in the pixel definition film. The first inorganic layer may cover the light emitting element.

In an embodiment of the inventive concept, a display panel includes a base layer, a circuit layer disposed on the base layer, a light emitting element layer disposed on the circuit layer, and an encapsulation layer disposed on the light emitting element layer. The encapsulation layer includes a first inorganic layer and a second inorganic layer disposed on the first inorganic layer. The first inorganic layer includes a laminate structure of two or more layers in which a barrier layer that includes a silicon oxide and a planarization layer that includes a silicon oxycarbide are alternately laminated, and the uppermost layer of the first inorganic layer is a planarization layer.

In an embodiment, in the planarization layer, based on a total content, a content of silicon may be approximately 20 at % to approximately 40 at %, a content of oxygen may be approximately 50 at % to approximately 70 at %, and a content of carbon may be greater than 0 at % to approximately 30 at %.

In an embodiment, a thickness of the uppermost layer of the first inorganic layer may be approximately 3 μm to approximately 10 μm.

In an embodiment, in the first inorganic layer, a sum of thicknesses of layers other than the uppermost layer may be approximately 10 nm to approximately 2 μm.

In an embodiment of the inventive concept, a display panel includes a base layer, a circuit layer disposed on the base layer, a light emitting element layer disposed on the circuit layer, and an encapsulation layer disposed on the light emitting element layer. The encapsulation layer includes a first inorganic layer and a second inorganic layer disposed on the first inorganic layer. The first inorganic layer includes a laminate structure of two or more layers in which at least one barrier layer and at least one planarization layer are alternately laminated. The at least one barrier layer includes silicon, and oxygen, and the at least one planarization layer includes silicon, oxygen, and carbon.

In an embodiment, the at least one barrier layer may include a first barrier layer to an m-th barrier layer, the at least one planarization layer may include a first planarization layer to an n-th planarization layer, m and n are each independently an integer of 2 or greater, the first barrier layer to the m-th barrier layer are alternately laminated with the first planarization layer to the n-th planarization layer, and the second inorganic layer is in contact with the first planarization layer.

In an embodiment, the first planarization layer may have a thickness greater than a thickness of each of the first planarization layer to the n-th planarization layer.

In an embodiment, in each of the first planarization layer to the n-th planarization layer, based on a total content, a content of silicon may be approximately 20 at % to approximately 40 at %, a content of oxygen may be approximately 50 at % to approximately 70 at %, and a content of carbon may be greater than 0 at % to approximately 30 at %.

In an embodiment, a composition ratio of any one of the first barrier layer to the m-th barrier layer may differ from the composition ratio of at least another barrier layer, and a composition ratio of any one of the first planarization layer to the n-th planarization layer may differ from the composition ratio of at least another planarization layer.

BRIEF DESCRIPTION OF THE FIGURES

FIG. 5 is a cross-sectional view of a portion of an electronic device according to an embodiment of the inventive concept.

DETAILED DESCRIPTION

Figure 1:
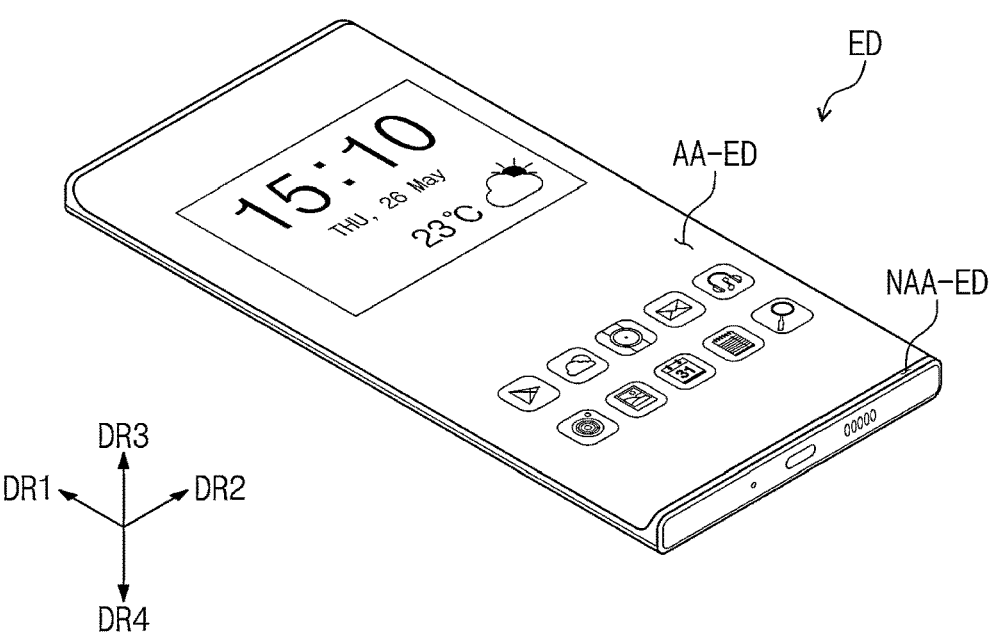
FIG. 1 is a perspective view of an electronic device according to an embodiment of the inventive concept.

The inventive concept may be modified in many alternate forms, and thus specific embodiments will be exemplified in the drawings and described in detail. It should be understood, however, that it is not intended to limit the inventive concept to the particular forms disclosed, but rather, is intended to cover all modifications, equivalents, and alternatives falling within the spirit and scope of the inventive concept.

In the present disclosure, when an element, or a region, a layer, a portion, etc., is referred to as being "on," "connected to," or "coupled to" another element, it means that the element may be directly disposed on/connected to/coupled to the other element, or that a third element may be disposed therebetween.

In the present disclosure, being "directly disposed" may mean that there is no layer, film, region, plate, etc., added between a portion of a layer, a film, a region, a plate, etc., and other portions.

Like reference numerals may refer to like elements.

The term "approximately" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "approximately" may mean within one or more standard deviations as understood by one of the ordinary skill in the art. Further, it is to be understood that while parameters may be described herein as having "approximately" a certain value, according to embodiments, the parameter may be exactly the certain value or approximately the certain value within a measurement error as would be understood by a person having ordinary skill in the art.

Hereinafter, a display panel and an electronic device according to an embodiment of the inventive concept will be described with reference to the accompanying drawings.

Figure 2:
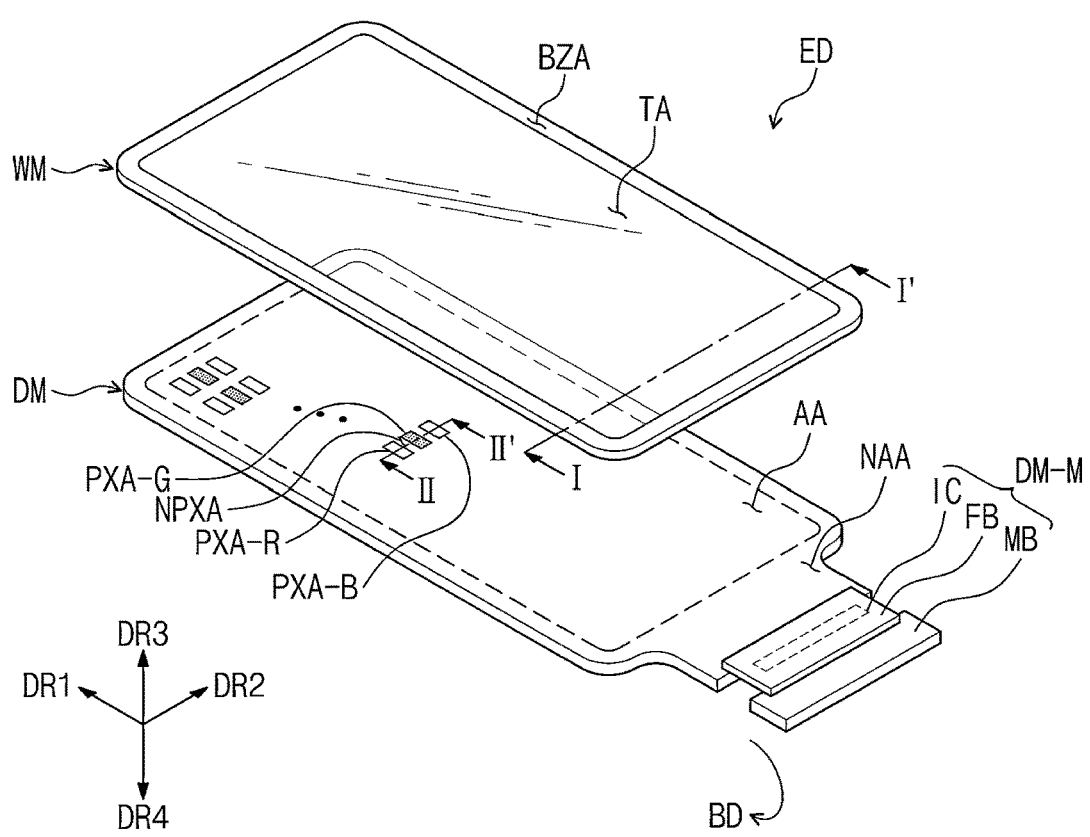
FIG. 2 is an exploded perspective view of an electronic device according to an embodiment of the inventive concept.
Figure 3:
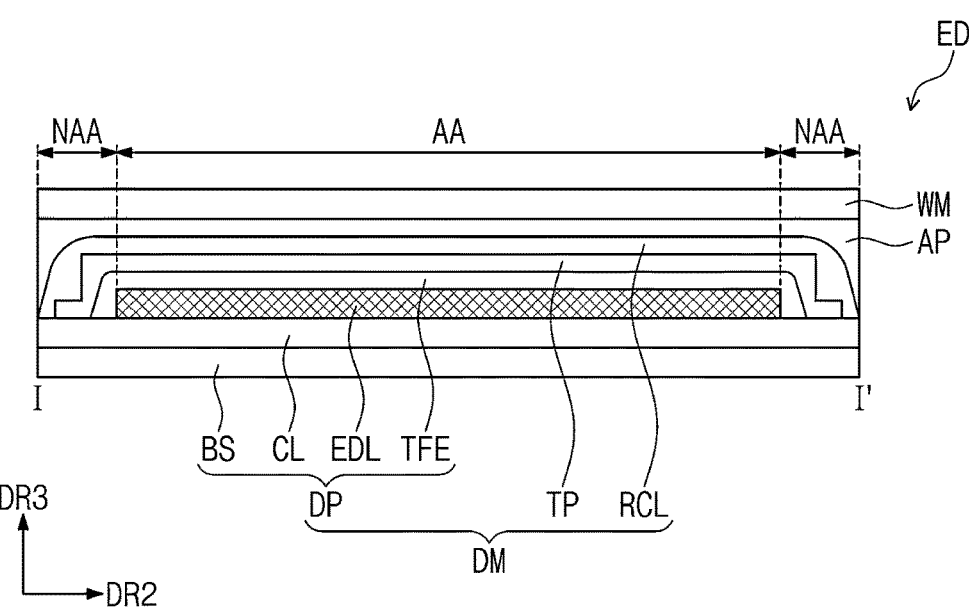
FIG. 3 is a cross-sectional view of an electronic device according to an embodiment of the inventive concept.
Figure 4:
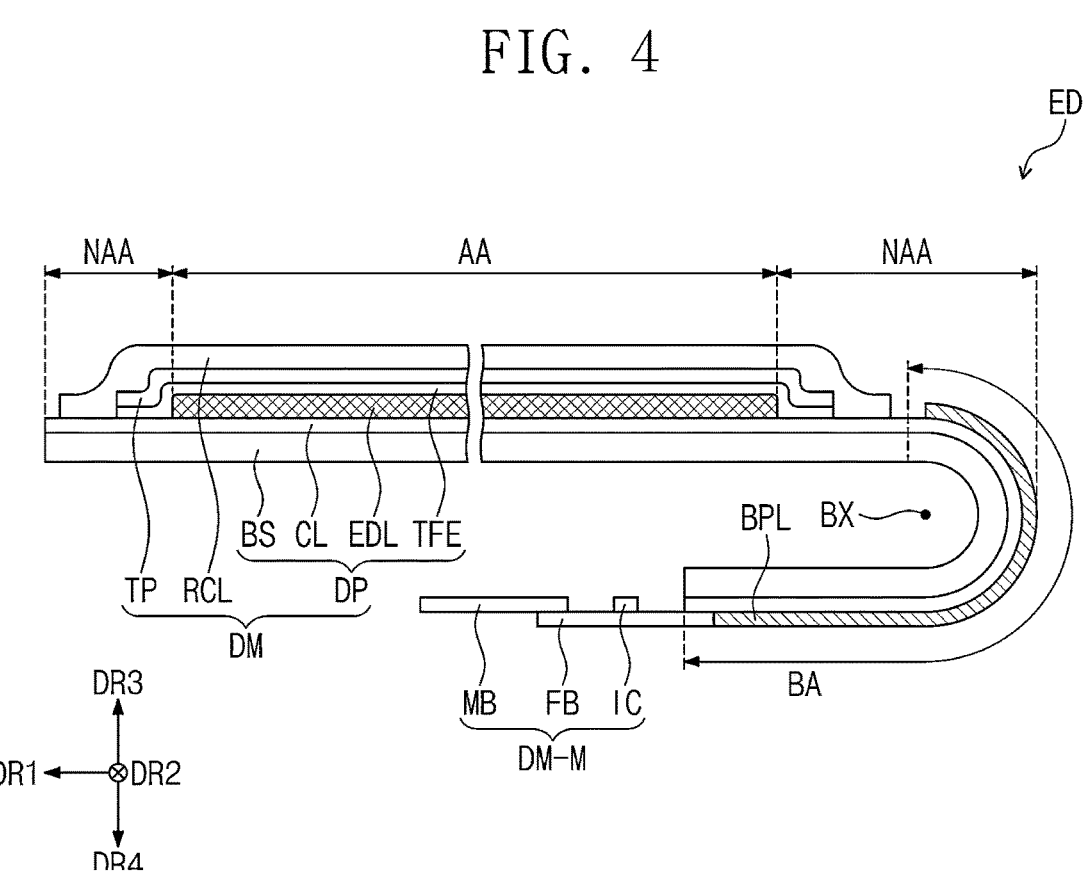
FIG. 4 is a cross-sectional view of an electronic device according to an embodiment of the inventive concept.

FIG. 1 is a perspective view of an electronic device ED according to an embodiment of the inventive concept. FIG. 2 is an exploded perspective view of the electronic device ED according to an embodiment of the inventive concept. FIG. 3 and FIG. 4 are cross-sectional views of the electronic device ED according to an embodiment of the inventive concept.

The electronic device ED according to an embodiment of the inventive concept illustrated in FIG. 1 to FIG. 4 is activated by an electrical signal. For example, the electronic device ED may be a mobile phone, a tablet computer, a monitor, a television, a car navigation system, a game console, or a wearable device, but embodiments of the inventive concept are not necessarily limited thereto. In FIG. 1 illustrates the electronic device ED as a mobile phone.

The electronic device ED according to an embodiment display images through an active region AA-ED. The active region AA-ED includes a portion parallel to a plane defined by a first direction DR1 and a second direction DR2. The active region AA-ED further includes a curved surface bent from at least one side of the plane defined by the first direction DR1 and the second direction DR2.

A peripheral region NAA-ED is adjacent to the active region AA-ED. The peripheral region NAA-ED surrounds the active region AA-ED. Accordingly, the shape of the active region AA-ED is substantially defined by the peripheral region NAA-ED. However, embodiments are not necessarily limited thereto, and in some embodiments, the peripheral region NAA-ED is adjacent to only one side of the active region AA-ED, or is omitted. The active region AA_ED of the electronic device ED according to an embodiment of the inventive concept may have one of various shapes, and is not necessarily limited to any one embodiment.

The electronic device ED of an embodiment illustrated in FIG. 1 includes two curved surfaces respectively bent from each side of the plane defined by the first direction DR1 and the second direction DR2. However, the shape of the active region AA-ED is not necessarily limited thereto. For example, in some embodiments, the active region AA-ED includes only the plane, or the active region AA-ED further includes four curved surfaces bent from, for example, four sides of the plane, respectively.

FIG. 1 and the following drawings illustrate, the first direction DR1 to a fourth direction DR4, and the first direction DR1 to the fourth direction DR4 described in the present disclosure are relative, and may be converted to different directions.

In the present disclosure, the first direction DR1 and the second direction DR2 are perpendicular to each other, and the third direction DR3 is normal with respect to the plane defined by the first direction DR1 and the second direction DR2. The fourth direction DR4 is normal to the plane defined by the first direction DR1 and the second direction DR2, and points in the opposite direction from the third direction DR3.

A thickness direction of the electronic device ED is parallel to the third direction axis DR3, which is normal to the plane defined by the first direction DR1 and the second direction DR2. In the present disclosure, a front surface (or an upper surface) and a rear surface (or a lower surface) of the electronic device ED are defined on the basis of the third direction DR3.

The electronic device ED of an embodiment includes a display module DM. The display module DM generates images and senses externally applied pressure. The display module DM according to an embodiment includes a display panel DP. The display module DM of an embodiment further include a sensor layer TP disposed on the display panel DP, and an optical layer RCL disposed on the sensor layer TP. However, embodiments of the inventive concept are not necessarily limited thereto, and in some embodiments, one or more of the sensor layer TP or the optical layer RCL is omitted.

The display module DM includes an active region AA and a peripheral region NAA. The active region AA is activated by an electrical signal. The peripheral region NAA is positioned adjacent to at least one side of the active region AA.

The active region AA corresponds to the active region AA-ED of the electronic device ED illustrated in FIG. 1. The peripheral region NAA corresponds to the peripheral region NAA-ED of the electronic device ED illustrated in FIG. 1.

Referring to FIG. 2, in an embodiment, the active region AA includes a plurality of light emitting regions PXA-R, PXA-G, and PXA-B. For example, the electronic device ED of an embodiment includes a first light emitting region PXA-R, a second light emitting region PXA-G, and a third light emitting region PXA-B. In an embodiment, the first light emitting region PXA-R emits red light, the second light emitting region PXA-G emits green light, and the third light emitting region PXA-B emits blue light.

When viewed in a plan view, the first to third light emitting regions PXA-R, PXA-G, and PXA-B are separated without overlapping each other. For example, a non-light emitting region NPXA is disposed between adjacent light emitting regions PXA-R, PXA-G, and PXA-B.

FIG. 2 illustrates that the light emitting regions PXA-R, PXA-G, and PXA-B are arranged in a row. That is, in the electronic device ED of an embodiment illustrated in FIG. 2, the first light emitting region PXA-R, the second light emitting region PXA-G, and the third light emitting region PXA-B are repeatedly arranged in that order along the second direction DR2.

However, the arrangement of the light emitting regions PXA-R, PXA-G, and PXA-B is not limited to that illustrated in FIG. 2. The arrangement order of the first light emitting region PXA-R, the second light emitting region PXA-G, and the third light emitting region PXA-B may be varied depending on the display quality characteristics of the electron device ED. For example, the arrangement of the light emitting regions PXA-R, PXA-G, and PXA-B may have a PENTILE® arrangement, or a Diamond Pixel™ arrangement.

In an embodiment, those light emitting regions PXA-R, PXA-G, and PXA-B that emit light of different wavelengths have different areas from each other. For example, the area refers to the area when viewed in a plan view defined by the first direction DR1 and the second direction DR2. However, embodiments of the inventive concept are not necessarily limited thereto, and in some embodiments, the light emitting regions PXA-R, PXA-G, and PXA-B have the same area. In addition, depending on the display quality characteristics of the electron device ED, the area ratio may be variously adjusted, and the shapes of the light emitting regions PXA-R, PXA-G, and PXA-B in a plan view may be variously changed.

FIG. 2 illustrates that each of the light emitting regions PXA-R, PXA-G, and PXA-B has a rectangular shape in a plan view, but embodiments of the inventive concept are not necessarily limited thereto. In some embodiments, each of the light emitting regions PXA-R, PXA-G, and PXA-B has one of a polygonal shape, a circular shape, etc., in a plan view.

In an embodiment, the peripheral region NAA surrounds the active region AA. However, embodiments of the inventive concept are not necessarily limited thereto, and in some embodiments, unlike that illustrated in FIG. 2, a portion of the peripheral region NAA is omitted. In the peripheral region NAA, a driving circuit or a driving line that drives the active region AA is disposed.

Referring to FIG. 4, in an embodiment, the peripheral region NAA includes a bendable portion BA bent with respect to a bending axis BX that extends in one direction, such as the second direction DR2. A bendable portion protective layer BPL is disposed in the bendable portion BA. The bendable portion protective layer BPL protect a circuit layer CL, etc., disposed in the peripheral region NAA. The bendable portion protective layer BPL prevents cracks from occurring in components in the circuit layer CL, etc., that are exposed in the bendable portion BA. The bendable portion protective layer BPL includes at least one of an acrylic polymer, a silicon-based polymer, or an imide-based polymer. However, embodiments of the inventive concept are not necessarily limited thereto.

However, in some embodiments, unlike that illustrated in FIG. 4, the bendable portion protective layer BPL is connected to or overlaps an edge of the optical layer RCL. In addition, some of components of the optical layer RCL extend to the bendable portion BA and to the bendable portion protective layer BPL. In addition, in an embodiment, the bendable portion protective layer BPL is omitted.

In an embodiment, the display panel DP generates images. The display panel DP is a light emitting-type display panel, such as one of an organic light emitting display panel, an inorganic light emitting display panel, a quantum-dot display panel, a micro-LED display panel, or a nano-LED display panel. Hereinafter, the display panel DP of an embodiment will be described as an organic light emitting display panel.

FIG. 3 is a cross-sectional view that corresponds to line I-I' of FIG. 2 of the inventive concept. Referring to FIG. 3 and FIG. 4, in an embodiment, the display panel DP includes a base layer BS, the circuit layer CL, a light emitting element layer EDL, and an encapsulation layer TFE.

The base layer BS provides a base surface on which the circuit layer CL is disposed. The base layer BS may be a rigid substrate, or a flexible substrate that can be bent, folded, rolled, etc. The base layer BS may be a glass substrate, a metal substrate, a polymer substrate, etc. However, embodiments of the inventive concept are not necessarily limited thereto, and the base layer BS may be one of an inorganic layer, an organic layer, or a composite material layer.

The circuit layer CL is disposed on the base layer BS. The circuit layer CL includes an insulation layer, a semiconductor pattern, a conductive pattern, a signal line, etc. An insulation layer, a semiconductor layer, and a conductive layer are formed above the base layer BS by coating, deposition, etc., and thereafter, the insulation layer, the semiconductor layer, and the conductive layer are selectively patterned through a photolithography process and an etching process that are performed a plurality of times. Thereafter, the semiconductor pattern, the conductive pattern, and the signal line in the circuit layer CL are formed.

The light emitting element layer EDL is disposed on the circuit layer CL. The light emitting element layer EDL includes a light emitting element. For example, the light emitting element is one of an organic light emitting material, an inorganic light emitting material, an organic-inorganic light emitting material, a quantum dot, a quantum rod, a micro-LED, or a nano-LED.

The encapsulation layer TFE is disposed on the light emitting element layer EDL. The encapsulation layer TFE covers the light emitting element layer EDL. The encapsulation layer TFE is disposed in the active region AA in which the light emitting element layer EDL is disposed, and extends into the peripheral region NAA in which no light emitting element layer EDL is disposed.

The encapsulation layer TFE protects the light emitting element layer EDL from foreign substances such as moisture, oxygen, and dust particles. The encapsulation layer TFE according to an embodiment of the inventive concept will be described in more detail below.

The sensor layer TP is disposed on the display panel DP. The sensor layer TP senses an externally applied input. The external input may be a user input. The user input may be one of various forms of external inputs, such as from a part of a user's body, light, heat, a pen, or pressure, etc.

The sensor layer TP is formed on the display layer DP through a continuous process. In an embodiment, the sensor layer TP is directly disposed on the display panel DP. For example, no third element is disposed between the sensor layer TP and the display panel DP. For example, no separate adhesive member is disposed between the sensor layer TP and the display panel DP. For example, the sensor layer TP is directly disposed on the encapsulation layer TFE of the display panel DP. However, embodiments are not necessarily limited thereto, and in some embodiments, the sensor layer TP and display panel DP are coupled to each other through an adhesive member. The adhesive member may include a typical adhesive or pressure-sensitive adhesive.

The optical layer RCL is disposed on the sensor layer TP. The optical layer RCL is directly disposed on the sensor layer TP. The optical layer RCL is formed on the sensor layer TP through a continuous process. The optical layer RCL reduces a reflectance of externally incident light incident from the display module DM. The optical layer RCL may include a polarizing layer, or a color filter layer. However, in an embodiment, the optical layer RCL is omitted.

In an embodiment of the inventive concept, the sensor layer TP is omitted. For example, the optical layer RCL is directly disposed on the display panel DP. In an embodiment, positions of the sensor layer TP and the optical layer RCL are interchangeable.

The electronic device ED further includes a driving unit DM-M electrically connected to the display module DM. The driving unit DM-M is electrically connected to the display panel DP and the sensor layer TP. The driving unit DM-M includes a driving chip IC. The driving chip IC generates or processes various electrical signals, and is electrically connected to the display panel DP, the sensor layer TP, etc., and controls the display panel DP, the sensor layer TP, etc.

The driving unit DM-M includes a flexible circuit board FB and a driving circuit board MB. The flexible circuit board FB is electrically connected to the display panel DP and the sensor layer TP on one side, and is electrically connected to the driving circuit board MB on the other side. The driving chip IC is disposed on the flexible circuit board FB. In this case, the flexible circuit board FB may also be referred to as a chip on film (CoF). However, in an embodiment, unlike that illustrated, the driving chip IC is disposed on the base layer BS of the display module DM.

FIG. 2 shows the driving unit DM-M as being connected to one side of the display module DM and unfolded, but as illustrated in FIG. 4, in the electronic device ED of an embodiment, the driving unit DM-M is bent BD in the fourth direction DR4. Referring to FIG. 4, in an embodiment, the driving unit DM-M is bent and overlaps the display panel DP in the third direction DR3.

Referring to FUG. 3, in an embodiment, the electronic device ED of an embodiment further includes a window WM disposed on the display module DM. The window WM covers the entire outside of the display module DM. The window WM is coupled to the display module DM through an adhesive layer AP.

The window WM has a shape that corresponds to the shape of the display module DM. In the electronic device ED of an embodiment, the window WM includes an optically transparent insulation material. The window WM may be a glass substrate or a polymer substrate. For example, the window WM is a chemically enhanced tempered glass substrate.

Referring to FIG. 2, in an embodiment, the window WM includes a transmissive portion TA and a bezel portion BZA. The transmissive portion TA corresponds to the active region AA of the display module DM, and the bezel portion BZA corresponds to the peripheral region NAA of the display module DM. The bezel portion BZA defines the shape of the transmissive portion TA. The bezel portion BZA is adjacent to the transmissive portion TA, and surrounds the transmissive portion TA. However, embodiments are not necessarily limited to that illustrated, and in some embodiments, the bezel portion BZA is adjacent to only one side of the transmissive portion TA, or a portion the bezel portion BZA is omitted.

Figure 5:
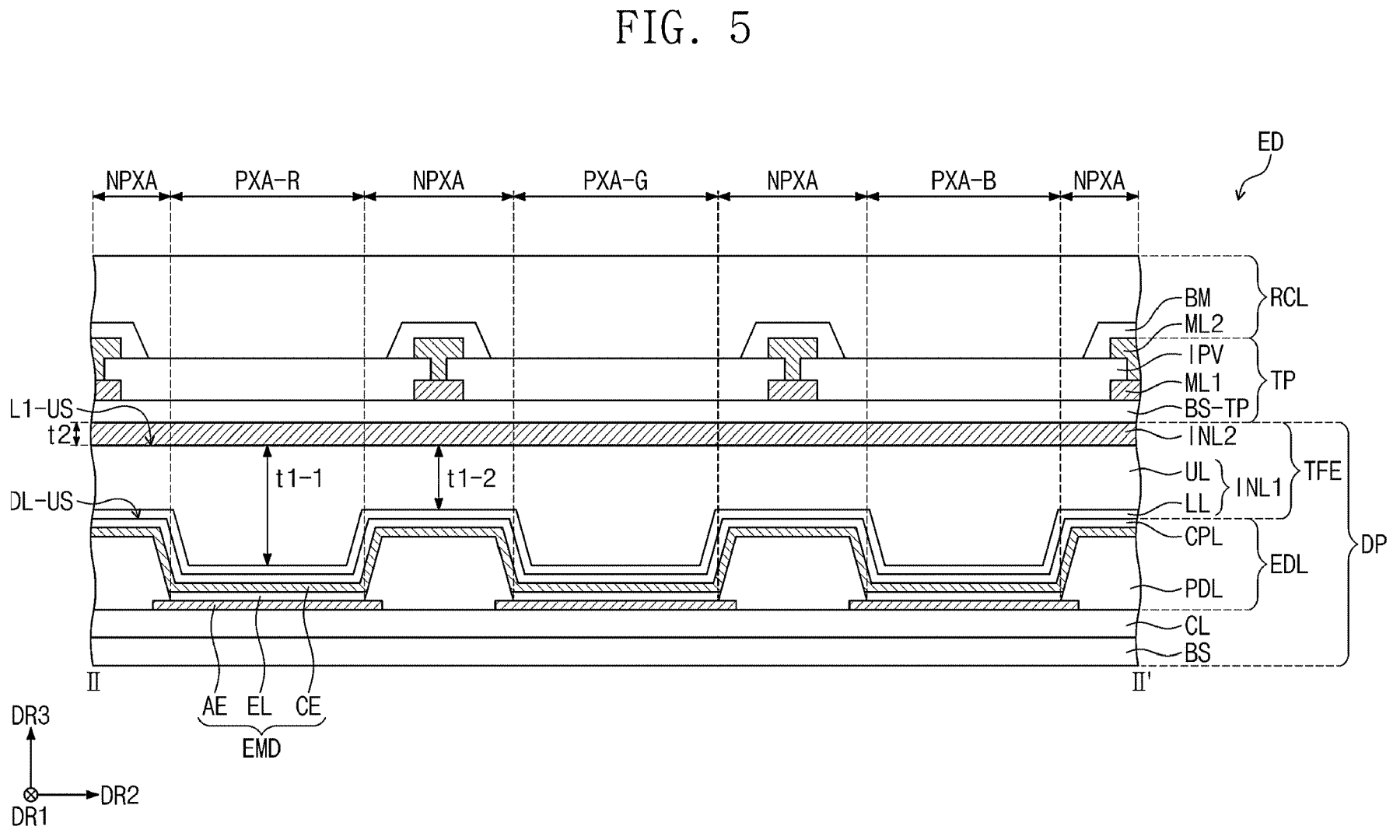
Figure 6:
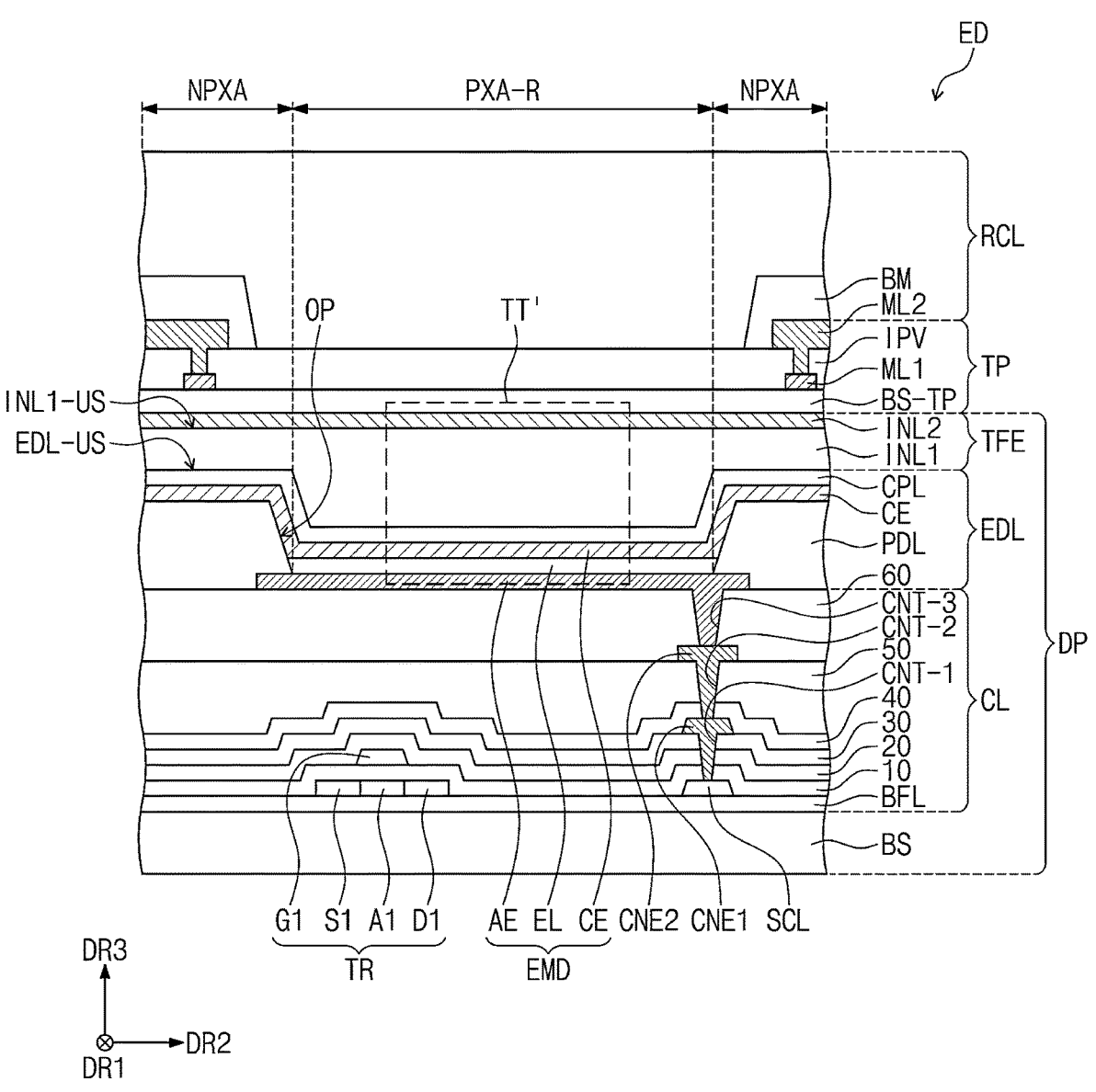
FIG. 6 is a cross-sectional view of a portion of an electronic device according to an embodiment of the inventive concept.
Figure 7:
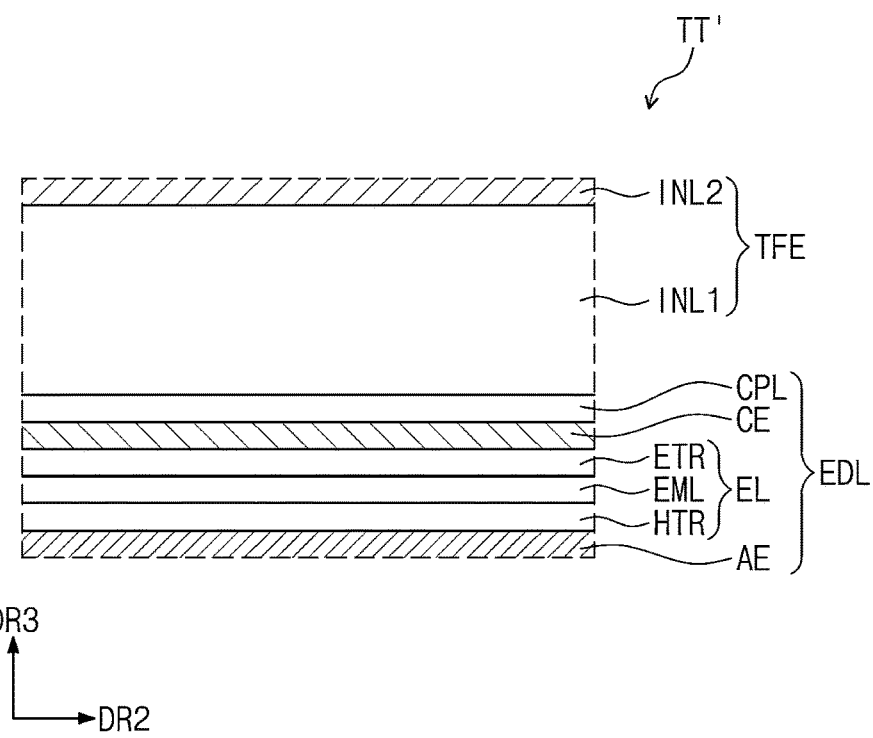
FIG. 7 is a cross-sectional view showing a portion of a display panel according to an embodiment of the inventive concept.

FIG. 5 and FIG. 6 are cross-sectional views of a portion of an electronic device according to an embodiment of the inventive concept. FIG. 7 is a cross-sectional view of a portion of a display panel according to an embodiment of the inventive concept.

FIG. 5 is a cross-sectional view that corresponds to line II-IF of FIG. 2. FIG. 5 illustrates the plurality of light emitting regions PXA-R, PXA-G, and PXA-B and the non-light emitting region NPXA of an embodiment. FIG. 6 illustrates a portion of the electronic device ED shown in FIG. 5. FIG. 6 illustrates the first light emitting region PXA-R and the non-light emitting region NPXA of an embodiment. FIG. 7 is a cross-sectional view of region TT' of FIG. 6.

Referring to FIG. 5 and FIG. 6, the electronic device ED of an embodiment includes the display panel DP, the sensor layer TP disposed on the display panel DP, and the optical layer RCL disposed on the sensor layer TP.

Referring to FIG. 5 to FIG. 7, the display panel DP of an embodiment includes the base layer BS, the circuit layer CL, the light emitting element layer EDL, and the encapsulation layer TFE that are sequentially laminated.

The base layer BS is one of a glass substrate, a metal substrate, a polymer substrate, etc. However, embodiments of the inventive concept are not necessarily limited thereto, and in some embodiments, the base layer BS is one of an inorganic layer, an organic layer, or a composite material layer.

The base layer BS may have a single-layered or multi-layered structure. For example, when the base layer BS has a multi-layered structure, the base layer BS has a three-layered structure of a synthetic resin layer, an adhesive layer, and a synthetic resin layer. In particular, the synthetic resin layer includes a polyimide-based resin. In addition, the synthetic resin layer includes at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, an "X~-based" resin means that a functional group of "X~" is included.

On the base layer BS, the circuit layer CL is disposed. The circuit layer CL includes a buffer layer BFL. The buffer layer BFL increases the coupling force between the base layer BS and a semiconductor pattern. The buffer layer BFL includes at least one of a silicon oxide layer, a silicon nitride layer, or a silicon oxynitride layer. For example, the buffer layer BFL includes two or more layers selected from the silicon oxide layer, the silicon nitride layer, or the silicon oxynitride layer that are alternately laminated.

The semiconductor pattern is disposed on the buffer layer BFL. The semiconductor pattern includes silicon. For example, the semiconductor pattern includes at least one of amorphous silicon, polycrystalline silicon, etc. However, embodiments of the inventive concept are not necessarily limited thereto, and in an embodiment, the semiconductor pattern includes a metal oxide.

FIG. 5 and FIG. 6 illustrate only a portion of the semi-conductor pattern, and the semiconductor pattern is further disposed in another region. The semiconductor pattern is arranged across the pixels according to a specific rule. The semiconductor pattern has different electrical properties, depending on whether or not the semiconductor pattern is doped. The semiconductor pattern includes a first region that has a high conductivity and a second region that has a low conductivity. The first region is doped with an N-type dopant or a P-type dopant. A P-type transistor includes a region doped with the P-type dopant, and an N-type transistor includes region doped with the N-type dopant. The second region may be a non-doped region, or a region doped to a lower concentration than the first region. The second region may also be referred to as a channel region.

The conductivity of the first region is greater than the conductivity of the second region, and the first region serves as an electrode or a signal line. The second region corresponds to an active region (or a channel) of a transistor. For example, a portion of the semiconductor pattern is an active region of the transistor, another portion thereof may be a source or a drain of the transistor, and the another portion thereof is a connection electrode or a connection signal line.

Each of the pixels has an equivalent circuit that includes a plurality of transistors, a capacitor, and a light emitting element, and the equivalent pixel circuit may be modified in various forms. FIG. 6 illustrates one transistor TR and a light emitting element EMD of a pixel.

A source S1, an active A1, and a drain D1 of the transistor TR are formed from a semiconductor pattern. The source S1 and the drain D1 extend in opposite directions from the active A1 in a cross section. FIG. 6 illustrates a portion of a connection signal line SCL formed from the semiconductor pattern. The connection signal line SCL is electrically connected to the drain D1 of the transistor TR in a plan view.

A first insulation layer 10 is disposed on the buffer layer BFL. The first insulation layer 10 commonly overlaps a plurality of pixels, and covers the semiconductor pattern. The first insulation layer 10 may be an inorganic layer and/or an organic layer, and may have a single-layered or multi-layered structure. The first insulation layer 10 includes at least one of an aluminum oxide, a titanium oxide, a silicon oxide, a silicon nitride, a silicon oxynitride, a zirconium oxide, or a hafnium oxide. In an embodiment, the first insulation layer 10 is a single-layered silicon oxide layer. Not only the first insulation layer 10 but also an insulation layer of the circuit layer CL to be described below is an inorganic layer and/or an organic layer, and may have a single-layered or multi-layered structure. The inorganic layer may include at least one of the above-described materials, but is not necessarily limited thereto.

A gate G1 of the transistor TR is disposed on the first insulation layer 10. The gate G1 is a portion of a metal pattern. The gate G1 overlaps the active A1. In a process of doping the semiconductor pattern, the gate G1 functions as a mask. The gate G1 includes at least one of titanium (Ti), silver (Ag), an alloy that contains silver, molybdenum (Mo), an alloy that contains molybdenum, aluminum (Al), an alloy that contains aluminum, aluminum nitride (AlN), tungsten (W), tungsten nitride (WN), copper (Cu), indium tin oxide (ITO), or indium zinc oxide (IZO), etc., but is not necessarily limited thereto.

A second insulation layer 20 is disposed on the first insulation layer 10, and covers the gate G1. The second insulation layer 20 may be an inorganic layer and/or an organic layer, and may have a single-layered or multi-layered structure that includes at least one of a silicon oxide layer, a silicon nitride layer, or a silicon oxynitride layer.

A third insulation layer 30 is disposed on the second insulation layer 20, and may have a single-layered or multi-layered structure including at least one of a silicon oxide layer, a silicon nitride layer, or a silicon oxynitride layer.

A first connection electrode CNE1 is disposed on the third insulation layer 30. The first connection electrode CNE1 is connected to the connection signal line SCL through a contact hole CNT-1 that penetrates through the first to third insulation layers 10, 20, and 30.

A fourth insulation layer 40 is disposed on the third insulation layer 30, and covers the first connection electrode CNE1. The fourth insulation layer 40 may have a single-layered or multi-layered structure that includes at least one of a silicon oxide layer, a silicon nitride layer, or a silicon oxynitride layer.

A fifth insulation layer 50 is disposed on the fourth insulation layer 40. The fifth insulation layer 50 is an organic layer.

A second connection electrode CNE2 is disposed on the fifth insulation layer 50. The second connection electrode CNE2 is connected to the first connection electrode CNE1 through a contact hole CNT-2 that penetrates through the fourth insulation layer 40 and the fifth insulation layer 50.

A sixth insulation layer 60 is disposed on the fifth insulation layer 50, and covers the second connection electrode CNE2. The sixth insulation layer 60 is an organic layer.

The light emitting element layer EDL, which includes the light emitting element EMD, is disposed on the circuit layer CL. The light emitting element layer EDL includes the light emitting element EMD and a pixel defining layer PDL, and the light emitting element EMD includes a functional layer EL disposed in an opening OP formed in the pixel definition film PDL.

Referring to FIG. 7, in an embodiment, the light emitting element EMD includes a first electrode AE, the functional layer EL, and a second electrode CE. The functional layer EL includes a light emitting layer EML. In addition, the functional layer EL further includes a hole transport region HTR and an electron transport region ETR. The first electrode AE is disposed on the sixth insulation layer 60. The first electrode AE may be connected to the second connection electrode CNE2 through a contact hole CNT-3 that penetrates through the sixth insulation layer 60. The first electrode AE includes at least one of Ag, Mg, Cu, Al, Pt, Pd, Au, Ni, Nd, Jr, Cr, Li, Ca, LiF, Mo, Ti, W, In, Sn, or Zn, a compound of two or more selected therefrom, a mixture of two or more selected therefrom, or an oxide thereof.

When the first electrode AE is a transmissive electrode, the first electrode AE includes a transparent metal oxide, such as an indium tin oxide (ITO), an indium zinc oxide (IZO), a zinc oxide (ZnO), an indium tin zinc oxide (ITZO), etc.

When the first electrode AE is a transflective electrode or a reflective electrode, the first electrode AE includes at least one of Ag, Mg, Cu, Al, Pt, Pd, Au, Ni, Nd, Jr, Cr, Li, Ca, LiF/Ca (laminate structure of LiF and Ca), LiF/Al (laminate structure of LiF and Al), Mo, Ti, W, or a compound or mixture thereof, such as a mixture of Ag and Mg. In an embodiment, the first electrode AE has a multi-layered structure that includes a reflective film or transflective film formed of the above materials, and a transparent conductive film formed of one of an indium tin oxide (ITO), an indium zinc oxide (IZO), a zinc oxide (ZnO), an indium tin zinc oxide (ITZO), etc. In an embodiment, the first electrode AE has a three-layered structure of ITO/Ag/ITO, but is not necessarily limited thereto.

The pixel definition film PDL is disposed on the sixth insulation layer 60, and covers a portion of the first electrode AE.

The opening OP is formed in the pixel definition film PDL. The opening OP in the pixel definition film PDL exposes at least a portion of the first electrode AE.

In an embodiment, the light emitting region PXA-R corresponds to regions of the first electrode AE exposed by the opening OP. The non-light emitting region NPXA surround the light emitting region PXA-R. For example, the pixel definition film PDL defines the light emitting regions PXA-R, PXA-G, and PXA-B. The light emitting regions PXA-R, PXA-G, and PXA-B and the non-light emitting region NPXA are distinguished by the pixel definition film PDL.

In addition, in an embodiment, the pixel definition film PDL includes a plurality of sub-pixel definition films laminated in a thickness direction.

In an embodiment, the pixel definition film PDL includes a polymer resin. For example, the pixel definition film PDL includes a polyacrylate-based resin or a polyimide-based resin. In addition, the pixel definition film PDL further includes an inorganic substance other than the polymer resin. In addition, the pixel definition film PDL may include a light absorbing material, or may include a black pigment or a black dye. Including a black pigment or a black dye in the pixel defining film PDL implements a black pixel defining film. Carbon black may be used as a black pigment or a black dye, but embodiments of the inventive concept are not necessarily limited thereto.

In addition, the pixel definition film PDL includes an inorganic substance. For example, the pixel definition film PDL includes at least one of a silicon nitride, a silicon oxide, a silicon oxynitride, etc.

The functional layer EL is disposed on the first electrode AE. In FIG. 5 and FIG. 6, the functional layer EL is illustrated as being disposed in the opening OP, but embodiments of the inventive concept are not necessarily limited thereto. The functional layer EL overlaps the plurality of light emitting regions PXA-R, PXA-G, and PXA-B.

In an embodiment, the light emitting layer EML in the functional layer EL is separately disposed in each of the light emitting regions PXA-R, PXA-G, and PXA-B. A plurality of light emitting layers EML are separately disposed in the light emitting regions PXA-R, PXA-G, and PXA-B divided by the pixel definition film PDL. Each of the plurality of light emitting layers EML emits at least one of red, green, or blue light. However, embodiments of the inventive concept are not necessarily limited thereto, and in some embodiments, the light emitting layer EML extends across the plurality of light emitting regions PXA-R, PXA-G, and PXA-B and the non-light emitting region NPXA and is provided as a common layer. For example, the light emitting layer EML emits blue or white light. The light emitting layer EML includes an organic light emitting material or a quantum dot material.

The hole transport region HTR and the electron transport region ETR are commonly disposed in the light emitting regions PXA-R, PXA-G, and PXA-B and the non-light emitting region NPXA. However, embodiments of the inventive concept are not necessarily limited thereto, and in some embodiments, the hole transport region HTR and the electron transport region ETR are separately disposed in each of the light emitting regions PXA-R, PXA-G, and PXA-B.

The hole transport region HTR is disposed between the first electrode AE and the light emitting layer EML. The hole transport region HTR includes a hole transport layer, and further includes a hole injection layer. The electron transport region ETR is disposed between the light emitting layer EML and the second electrode CE. The electron transport region ETR includes an electron transport layer, and further includes an electron injection layer.

In some embodiments, the light emitting layer EML includes a fluorescent or phosphorescent material that emits one of red, green, or blue light. In addition, the light emitting layer EML includes an organometallic complex as a light emitting material. In some embodiments, the light emitting layer EML includes a quantum dot as a light emitting material.

The second electrode CE is disposed on the functional layer EL. The second electrode CE is formed as a single body, and extends across the light emitting regions PXA-R, PXA-G, and PXA-B and the non-light emitting region NPXA as a common layer. The second electrode CE includes at least one of Ag, Mg, Cu, Al, Pt, Pd, Au, Ni, Nd, Jr, Cr, Li, Ca, LiF, Mo, Ti, W, In, Sn, or Zn, a compound of two or more selected therefrom, a mixture of two or more selected therefrom, or an oxide thereof.

The second electrode CE is one of a transmissive electrode, a transflective electrode, or a reflective electrode. When the second electrode CE is a transmissive electrode, the second electrode CE is formed of a transparent metal oxide, such as an indium tin oxide (ITO), an indium zinc oxide (IZO), a zinc oxide (ZnO), an indium tin zinc oxide (ITZO), etc.

When the second electrode CE is a transflective electrode or reflective electrode, the second electrode CE includes at least one of Ag, Mg, Cu, Al, Pt, Pd, Au, Ni, Nd, Jr, Cr, Li, Ca, LiF/Ca (laminate structure of LiF and Ca), LiF/Al (laminate structure of LiF and Al), Mo, Ti, Yb, W, or a compound or mixture of the same, such as AgMg, AgYb, or MgYb. In some embodiments, the second electrode CE has a multi-layered structure that includes a reflective film or transflective film formed of the above materials, and a transparent conductive film formed of an indium tin oxide (ITO), an indium zinc oxide (IZO), a zinc oxide (ZnO), an indium tin zinc oxide (ITZO), etc. For example, the second electrode CE may include one of the above-described metal materials, a combination of two or more of the above-described metals, an oxide of one of the above-described metals, etc.

In an embodiment, the light emitting element layer EDL further includes a capping layer CPL disposed on the light emitting element EMD. The capping layer CPL is disposed on the second electrode CE. The capping layer CPL includes a single layer or multiple layers.

In an embodiment, the capping layer CPL may be an inorganic layer or an organic layer. For example, when the capping layer CPL includes an inorganic substance, the inorganic substance includes at least one of an alkaline metal compound such as LiF, an alkaline earth metal compound such as MgF2, or SiON, SiN, SiOy, or the like. For example, when the capping layer CPL includes an organic substance, the organic substance includes at least one of α-NPD, NPB, TPD, m-MTDATA, Alq3, CuPc, N4,N4,N4',N4'-tetra(biphe-nyl-4-yl)biphenyl-4,4'-diamine (TPD15), 4,4',4''-tris(carba-zol-9-yl) triphenylamine (TCTA), etc., or an epoxy resin or an acrylate such as a methacrylate.

The capping layer CPL is a buffer layer that protects the light emitting element EMD. The refractive index of the capping layer CPL is approximately 1.6 or greater. For example, the refractive index of the capping layer CPL is approximately 1.9. Since the capping layer CPL has a refractive index of approximately 1.9, the light extraction efficiency, etc., of the light emitting element layer EDL is increased.

An upper surface EDL-US of the light emitting element layer EDL is determined by the shapes of the pixel definition film PDL and the light emitting element layer EDL. For example, the upper surface EDL-US of the light emitting element layer EDL is not flat but includes steps. The height of the upper surface EDL-US of the light emitting element layer EDL with respect to the base layer BS in the light emitting regions PXA-R, PXA-G, and PXA-B and the non-light emitting region NPXA differ from each other. A step in the upper surface EDL-US of the light emitting element layer EDL is planarized by the encapsulation layer TFE.

The encapsulation layer TFE is disposed on the light emitting element layer EDL. The encapsulation layer TFE includes a first inorganic layer INL1 disposed on the light emitting element layer EDL, and a second inorganic layer INL2 disposed on the first inorganic layer INL1. The encapsulation layer TFE covers a step or a curve caused by the light emitting element layer EDL.

The first inorganic layer INL1 is disposed on the light emitting element layer EDL and covers a step of the light emitting element layer E. For example, the first inorganic layer INL1 covers a step of the upper surface EDL-US of the light emitting element layer EDL, and provides a flat surface for the second inorganic layer INL2.

The first inorganic layer INL1 includes a laminate structure of two or more layers in which a barrier layer and a planarization layer are alternately laminated. For example, the first inorganic layer INL1 includes a barrier layer disposed on the light emitting element layer EDL and a planarization layer disposed on the barrier layer. In an embodiment, the first inorganic layer INL1 further includes an additional planarization layer and an additional barrier layer disposed in a lower portion of the barrier layer. For example, when a barrier layer and a planarization layer are alternately laminated, the uppermost layer of the first inorganic layer INL1 is a planarization layer.

The barrier layer includes silicon and oxygen. For example, the barrier layer includes a silicon oxide. A planarization layer includes silicon, oxygen, and carbon. For example, a planarization layer includes a silicon oxycarbide.

The second inorganic layer INL2 is disposed on the first inorganic layer INL1. The second inorganic layer INL2 includes at least one of a silicon oxide, a silicon nitride, or a silicon oxynitride.

The sensor layer TP is disposed on the display panel DP. In an embodiment, the sensor layer TP is directly disposed on the second inorganic layer INL2. The sensor layer TP may be referred to as a sensor, an input sensing layer, or an input sensing panel. The sensor layer TP includes a base layer BS-TP, a first conductive layer ML1, a sensing insulation layer IPV, and a second conductive layer ML2.

The sensing base layer BS-TP is directly disposed on the display panel DP. In an embodiment, the sensing base layer BS-TP is an inorganic layer that includes at least one of a silicon nitride, a silicon oxynitride, or a silicon oxide. In an embodiment, the sensing base layer BS-TP is an organic layer that includes one of an epoxy-based resin, an acrylic resin, or an imide-based resin. The sensing base layer BS-TP may have a single-layered structure, or may have a multi-layered structure in which layers are laminated along the third direction DR3.

Each of the first conductive layer ML1 and the second conductive layer ML2 may have a single-layered structure or a multi-layered structure in which layers are laminated along the third direction DR3. A conductive layer of a single-layered structure includes one of a metal layer or a transparent conductive layer. The metal layer includes at least one of Mo, Ag, Ti, Cu, Al, or an alloy thereof. The transparent conductive layer includes a transparent conductive oxide such as at least one of an indium tin oxide (ITO), an indium zinc oxide (IZO), a zinc oxide (ZnO), a zinc peroxide (ZnO2), an indium tin zinc oxide (IZTO), etc. The transparent conductive layer may include a conductive polymer such as PEDOT, a metal nanowire, graphene, etc.

A conductive layer of a multi-layered structure includes metal layers. In an embodiment, the metal layers have a three-layered structure of Ti/Al/Ti. The conductive layer of a multi-layered structure includes at least one metal layer and at least one transparent conductive layer.

The sensing insulation layer IPV is disposed between the first conductive layer ML1 and the second conductive layer ML2. In an embodiment, the sensing insulation layer IPV includes an inorganic film. The inorganic film includes at least one of an aluminum oxide, a titanium oxide, a silicon oxide, a silicon nitride, a silicon oxynitride, a zirconium oxide, or a hafnium oxide.

In an embodiment, the sensing insulation layer IPV includes an organic film. The organic film includes at least one of an acrylic resin, a methacryl-based resin, polyisoprene, a vinyl-based resin, an epoxy-based resin, a urethanebased resin, a cellulose-based resin, a siloxane-based resin, a polyimide-based resin, a polyamide-based resin, or a perylene-based resin.

The optical layer RCL is disposed on the sensor layer TP. In an embodiment, the optical layer RCL is formed on the sensor layer TP through a continuous process. However, embodiments of the inventive concept are not necessarily limited thereto.

The optical layer RCL includes a pigment or a dye. In addition, the optical layer RCL includes a plurality of filters that transmit light of different wavelength regions. Each of the different wavelength filters is disposed on a corresponding light emitting region PXA-R, PXA-G, or PXA-B.

The optical layer RCL further includes a partition layer BM. A material of the partition layer BM is not particularly limited as long as it absorbs light. The partition layer BM is black, and in an embodiment, the partition layer BM includes a black coloring agent. The black coloring agent is one of a black dye or a black pigment. The black coloring agent includes at least one of carbon black, a metal such as chromium, or an oxide thereof.

The partition layer BM covers the second conductive layer ML2 of the sensor layer TP. The partition layer BM prevents the reflection of external light from the second conductive layer ML2.

However, embodiments of the inventive concept are not necessarily limited thereto, and in some embodiments, at least one of the sensor layer TP or the optical layer RCL is omitted.

Figure 8:
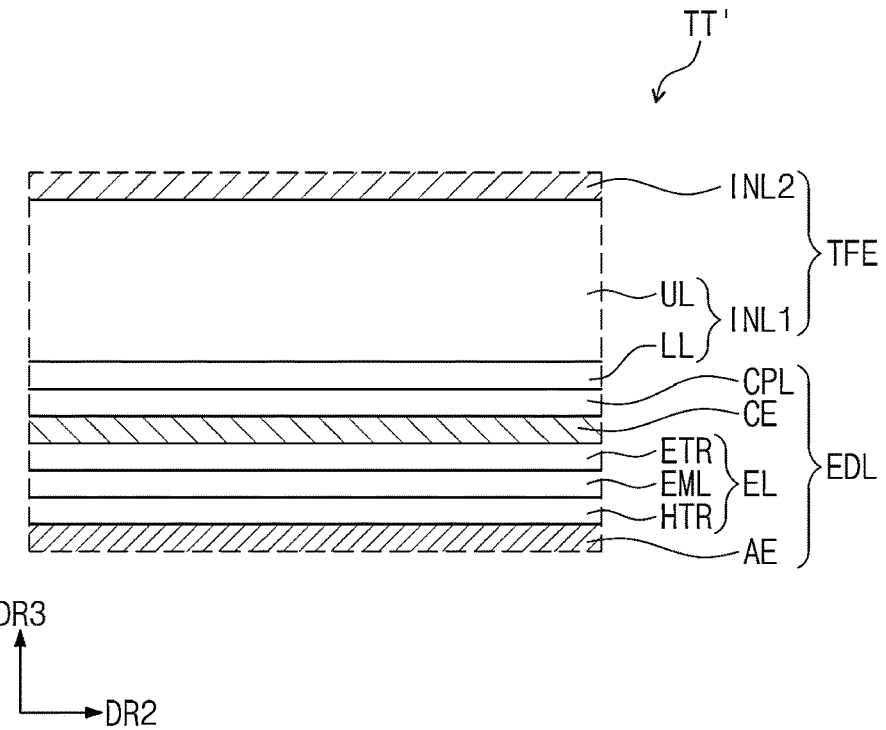
FIG. 8 is a cross-sectional view of a portion of a display panel according to an embodiment of the inventive concept.

FIG. 8 is a cross-sectional view of a portion of the display panel DP according to an embodiment of the inventive concept. FIG. 8 shows region TT' of FIG. 6.

Referring to FIG. 8, in an embodiment, the first inorganic layer INL1 of the encapsulation layer TFE includes a lower layer LL and an upper layer UL disposed on the lower layer LL. The lower layer LL is disposed on the light emitting element layer EDL.

The first inorganic layer INL1 includes both barrier properties and planarization properties. Specifically, the first inorganic layer INL1 includes the lower layer LL, which includes a barrier layer that contains a silicon oxide, and thus has barrier properties that prevent external oxygen and moisture from penetrating into the light emitting element EMD. In addition, the first inorganic layer INL1 includes the upper layer UL, which includes a silicon oxycarbide, and thus has planarization properties. In addition, the lower layer LL further includes a planarization layer that includes a silicon oxycarbide, so that the lower layer LL has both barrier properties and planarization properties.

The lower layer LL and the upper layer UL are both provided using chemical vapor deposition (CVD). In an embodiment, the lower layer LL and the upper layer UL are continuously deposited in the same chamber. The lower layer LL is deposited on the light emitting element layer EDL, and the upper layer UL may be deposited on the lower layer LL. The upper layer UL may be deposited to a thickness sufficient to cover a step of the light emitting element layer EDL and provide an upper surface INL1-US of the first inorganic layer INL1 with a flat surface.

Since the first inorganic layer INL1 is formed by chemical vapor deposition (CVD), a printing process, a coating process, a curing process, and an ashing process that form a planarizing organic layer of a typical encapsulation layer can be omitted. For example, the encapsulation layer TFE is formed only by a deposition process. In addition, a dam structure that prevents the flow of a typical organic layer can be omitted. Therefore, in the electronic apparatus ED that includes the encapsulation layer TFE of an embodiment of the inventive concept, process cost and process time can be reduced, so that productivity can be increased.

In an embodiment of the inventive concept, the lower layer LL includes at least one layer. In an embodiment of the inventive concept, the lower layer LL includes at least one barrier layer that includes a silicon oxide. In an embodiment, the barrier layer is composed of silicon and oxygen. The atomic percent (at %) of the silicon and oxygen that constitute the barrier layer is 1:2.

The barrier layer blocks the penetration of oxygen and moisture from the outside into the light emitting element EMD. The barrier layer is formed at a high deposition rate and a temperature of 100° C. or lower, so that the formation process has high productivity and minimizes damage to the light emitting element EMD.

The lower layer LL further includes a planarization layer that includes a silicon oxycarbide. For example, the lower layer LL includes a planarization layer composed silicon, oxygen, and carbon. In the planarization layer, based on the total content, the content of silicon is approximately 20 at % to approximately 40 at %, the content of oxygen is approximately 50 at % to approximately 70 at %, and the content of carbon is greater than 0 at % to approximately 30 at %. In an embodiment, based on the total content, the content of carbon is greater than 0 at % to approximately 15 at %.

The planarization layer covers dust particles that may be present on the upper surface EDL-US of the light emitting element layer EDL. The planarization layer is formed at a high deposition rate and a temperature of 100° C. or lower, so that the formation process has high productivity and minimizes damage to the light emitting element EMD.

The upper layer UL has a single-layered structure. For example, the upper layer UL is a planarization layer. The planarization layer includes silicon, oxygen, and carbon.

Figure 9:
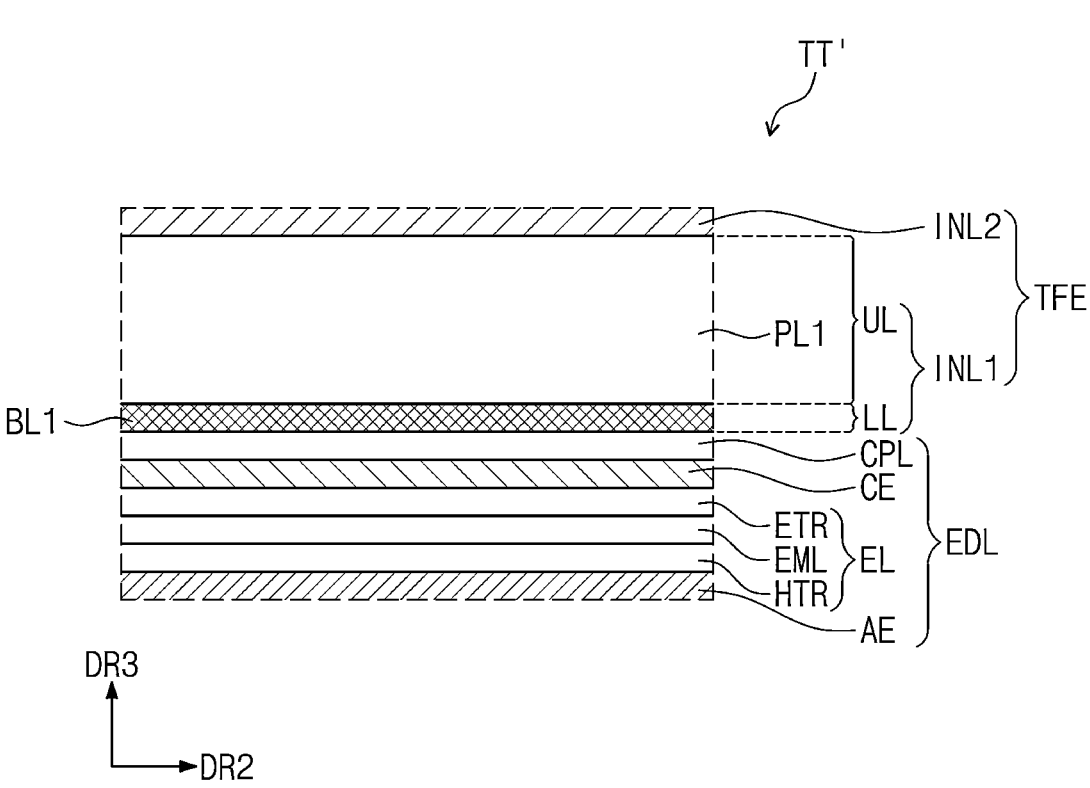
FIG. 9 is a cross-sectional view of a portion of a display panel according to an embodiment of the inventive concept.
Figure 10:
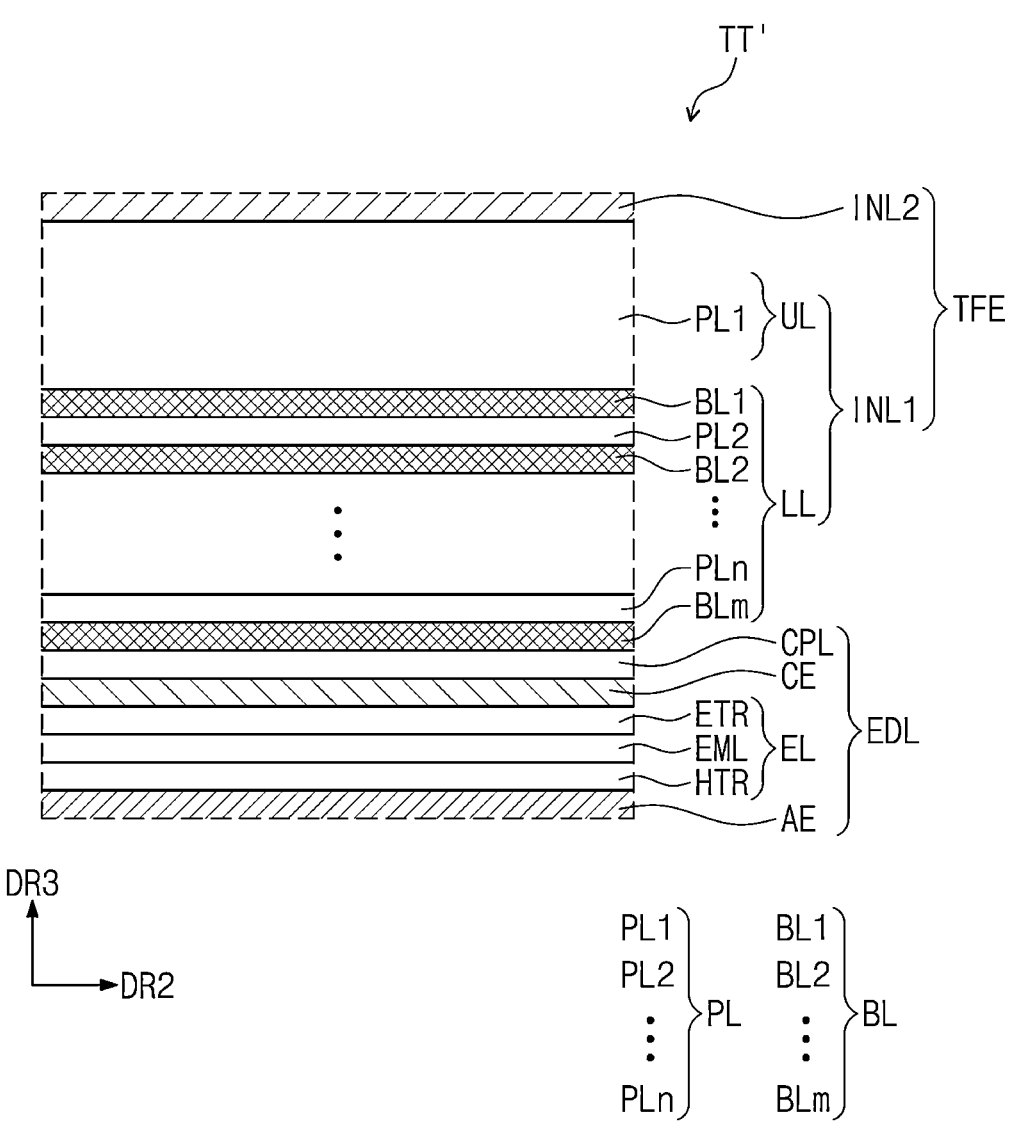
FIG. 10 is a cross-sectional view of a portion of a display panel according to an embodiment of the inventive concept.
Figure 11:
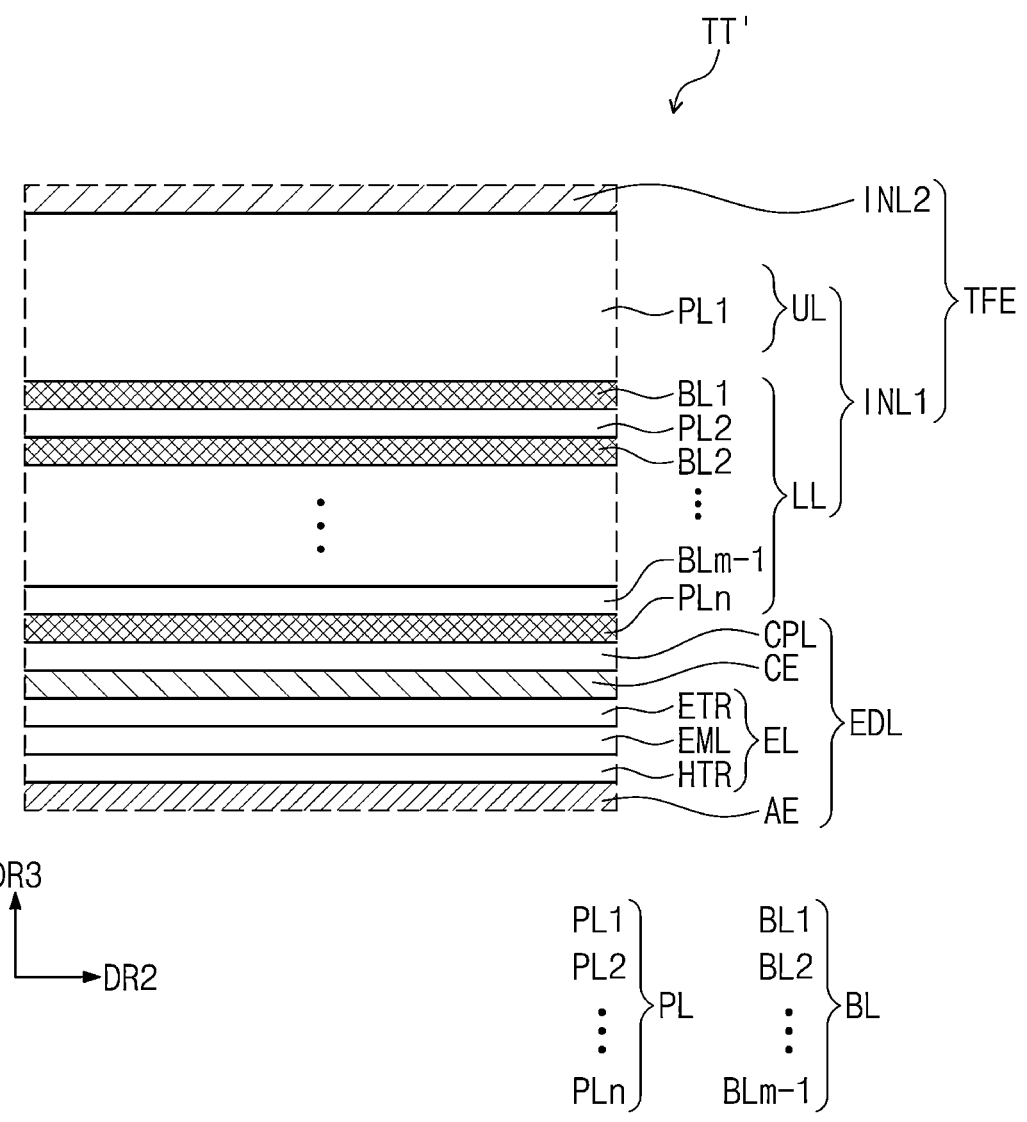
FIG. 11 is a cross-sectional view of a portion of a display panel according to an embodiment of the inventive concept.

FIG. 9 to FIG. 11 are cross-sectional views of a portion of the display panel DP according to an embodiment of the inventive concept. FIG. 9 to FIG. 11 each illustrates a region TT' of FIG. 6.

The lower layer LL may have a single-layered or a multi-layered structure.

Referring to FIG. 9, in an embodiment, when the lower layer LL has a single-layered structure, the lower layer LL is a first barrier layer BL1. The upper layer UL is a first planarization layer PL1. For example, when the lower layer LL has a single-layered structure, the encapsulation layer TFE includes the first barrier layer BL1 and the first planarization layer PL1 disposed on the first barrier layer BL1.

When the lower layer LL has a multi-layered structure, as shown in FIGS. 10 and 11, the lower layer LL includes at least one barrier layer BL and at least one planarization layer PL. When the lower layer LL has a multi-layered structure, a layer in contact with the light emitting element layer EDL is a lowermost layer of the lower layer LL or the lowermost layer of the first inorganic layer INL1, and a layer in contact with the upper layer UL is the uppermost layer of the lower layer LL.

Referring to FIGS. 10 and 11, lower layer LL has a laminate structure that includes two or more layers in which the barrier layer BL and the planarization layer PL are alternately laminated, and the upper layer UL is in contact with the barrier layer BL. The uppermost layer of the lower layer LL is a barrier layer BL. For example, when the lower layer LL has a double-layered structure, the lowermost layer of the lower layer LL is the planarization layer PL, and the uppermost layer of the lower layer LL is the barrier layer BL.

Referring to FIG. 10, in an embodiment, the first inorganic layer INL1 includes at least one barrier layer BL and at least one planarization layer PL. The at least one barrier layer BL includes a plurality of m barrier layers. For example, the at least one barrier layer BL includes first to m-th barrier layers BL1 to BLm. The at least one planarization layer PL includes a plurality of n planarization layers. For example, the at least one planarization layer PL includes first to n-th planarization layers PL1 to PLn. The numbers m and the n are each independently an integer of 2 or greater. The numbers m and the n may be equal to each other, or may differ from each other.

The first inorganic layer INL1 includes a structure in which m barrier layers BL1 to BLm and n planarization layers PL1 to PLn are alternately laminated.

Accordingly, coverage properties and barrier properties of the first inorganic layer IN1L are increased.

For example, when n is 2 and m is 2, the first inorganic layer INL1 has a four-layered structure. Specifically, the first inorganic layer INL1 includes a second barrier layer BL2 disposed on the light emitting element layer EDL, a second planarization layer PL2 disposed on the second barrier layer BL2, the first barrier layer BL1 disposed on the second planarization layer PL2, and the first planarization layer PL1 disposed on the first barrier layer BL1.

The first planarization layer PL1 corresponds to the upper layer UL, and the first to m-th barrier layers BL1 to BLm and the second to n-th planarization layers PL2 to PLn correspond to the lower layer LL. The first barrier layer BL1 is the uppermost layer of the lower layer LL.

In FIG. 10, shows the lowermost layer of the lower layer LL as being the m-th barrier layer BLm, but embodiments of the inventive concept are not necessarily limited thereto. Since the uppermost layer of the first inorganic layer INL1 is the barrier layer BL1, and the second inorganic layer INL2 is the first planarization layer PL1, even at a boundary portion between the first inorganic layer INL1 and the second inorganic layer INL2, the barrier layer BL and the planarization layer PL are alternately laminated.

Referring to FIG. 11, in an embodiment, the first inorganic layer INL1 includes at least one barrier layer BL and at least one planarization layer PL. The at least one barrier layer BL includes a plurality of m-1 barrier layers. For example, the at least one barrier layer BL includes first to m-1 barrier layers BL1 to BLm-1. The at least one planarization layer PL includes a plurality of n planarization layers. For example, the at least one planarization layer PL includes first to n-th planarization layers PL1 to PLn. The m and the n are each independently an integer of 2 or greater.

The first planarization layer PL1 corresponds to the upper layer UL, and the first to m−1-th barrier layers BL1 to BLm-1 and the second to n-th planarization layers PL2 to PLn correspond to the lower layer LL. The first barrier layer BL1 is the uppermost layer of the lower layer LL. In FIG. 11, the lowermost layer of the lower layer LL is the n-th planarization layer PLn. The encapsulation layer TFE of an embodiment of the inventive concept includes a laminate structure of two or more layers in which the barrier layer BL and the planarization layer PL are alternately laminated, and thus, can be formed using only chemical vapor deposition (CVD). For example, the encapsulation layer TFE is formed by continuously changing only deposition conditions in the same chamber and by using only chemical vapor deposition (CVD) equipment.

In an embodiment, the thickness of the lower layer LL is approximately 10 nm to approximately 2 μm. For example, the thickness of the lower layer LL is approximately 100 nm to approximately 2 μm, or approximately 100 nm to approximately 1 μm.

The thickness of each of the barrier layers BL1, BL2 to BLm in the lower layer LL is approximately 10 nm to approximately 500 nm. For example, the thickness of each of the barrier layers BL1, BL2 to BLm in the lower layer LL is approximately 10 nm to approximately 100 nm.

The thickness of each of the planarization layers PL2 to PLn in the lower layer LL is approximately 10 nm to approximately 1 μm. For example, the thickness of each of the planarization layers PL2 to PLn in the lower layer is approximately 10 nm to approximately 500 nm, or approximately 10 nm to approximately 100 nm.

The first inorganic layer INL1 includes the upper layer UL disposed on the lower layer LL, and the upper layer UL includes a silicon oxycarbide. That is, the upper layer UL includes silicon, oxygen, and carbon. In the upper layer UL, based on the total content, the content of silicon is approximately 20 at % to approximately 40 at %, the content of oxygen is approximately 50 at % to approximately 70 at %, and the content of carbon is greater than 0 at % to approximately 30 at %. In an embodiment, based on the total content, the content of carbon is greater than 0 at % to approximately 15 at %.

The upper layer UL covers a step in the upper surface EDL-US of the light emitting element layer EDL, thereby planarizing the upper surface INL1-US of the first inorganic layer INL1. The upper layer UL is deposited to a thickness sufficient to provide the upper surface INL1-US of the first inorganic layer INL1 with a flat surface. The upper layer UL has a single-layered structure. In an embodiment of the present disclosure, the upper layer UL may be referred to as the uppermost layer of the first inorganic layer INL1 or the first planarization layer PL1.

The thickness of the upper layer UL is approximately 3 μm to approximately 10 μm. In an embodiment of the present disclosure, a thickness is measured in the third direction DR3. Referring to FIG. 5, the thickness of the upper layer UL in an embodiment of the present disclosure is an average of a thickness t1-1 of a portion that overlaps the light emitting regions PXA-R, PXA-G, and PXA-B and a thickness t1-2 of a portion that overlaps the non-light emitting region NPXA. The thickness of the upper layer UL corresponds to an average thickness of the entire upper layer UL that fills a space between the lower layer LL and the second inorganic layer INL2.

The second inorganic layer INL2 is disposed on the first inorganic layer INL1. The second inorganic layer INL2 is in direct contact with the first planarization layer PL1. The second inorganic layer INL2 functions as a barrier that protects the light emitting element layer EDL from moisture and oxygen. The second inorganic layer INL2 includes at least one of a silicon oxide, a silicon nitride, or a silicon oxynitride.

A thickness t2 of the second inorganic layer INL2 is approximately 1 μm or less. The second inorganic layer INL2 is a planarization layer on the upper surface INL1-US of the flat first inorganic layer INL1. Specifically, the second inorganic layer INL2 is a planarization layer formed on the upper layer UL of the first inorganic layer INL1.

The second inorganic layer INL2 is provided using chemical vapor deposition (CVD). The second inorganic layer INL2 is directly deposited and formed on the first inorganic layer INL1. The second inorganic layer INL2 may be deposited in the same chamber as that used to deposit the first inorganic layer INL1, or may be deposited in a different chamber.

Figure 12:
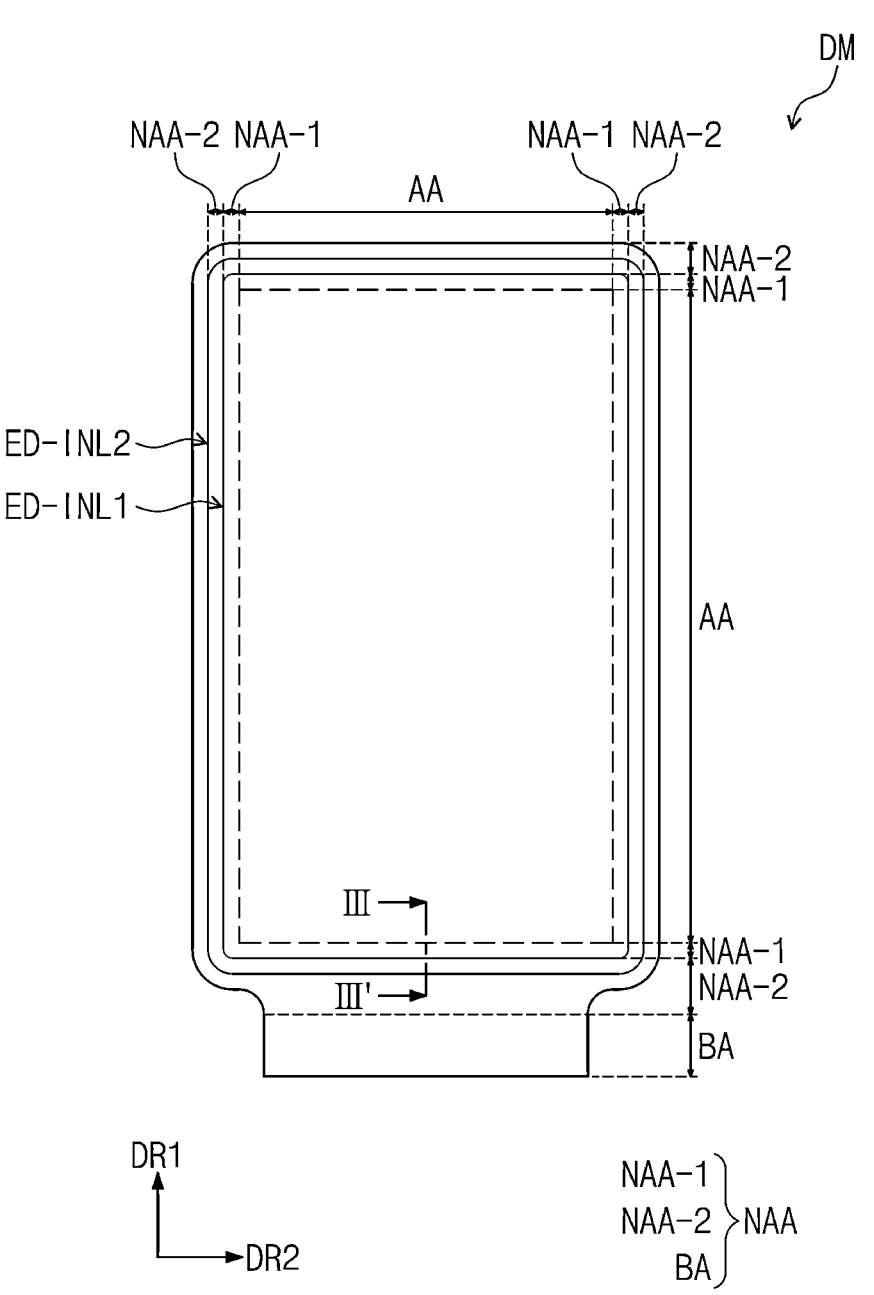
FIG. 12 is a plan view of a display module according to an embodiment of the inventive concept.

FIG. 12 is a plan view of the display module DM according to an embodiment of the inventive concept.

Referring to FIG. 12, in an embodiment, the display module DM includes the active region AA and the peripheral region NAA disposed at the periphery of the active region AA, and the peripheral region NAA includes a first peripheral region NAA-1 adjacent to the active region AA, and a second peripheral region NAA-2 spaced apart from the active region AA. In addition, the peripheral region NAA includes the bendable portion BA that extends from at least one side surface of the second peripheral region NAA-2.

The first inorganic layer INL1 and the second inorganic layer INL2 cover the entire active region AA, and extend to a portion of the peripheral region NAA. In a plan view, the area of the second inorganic layer INL2 is greater than the area of the first inorganic layer INL1. An edge ED-INL1 of the first inorganic layer INL1 and an edge ED-INL2 of the second inorganic layer INL2 do not match. For example the edge ED-INL1 of the first inorganic layer INL1 is spaced apart from the edge ED-INL2 of the second inorganic layer INL2.

The edge ED-INL1 of the first inorganic layer INL1 and the edge ED-INL2 of the second inorganic layer INL2 are located in the peripheral region NAA. For example, the edge ED-INL1 of the first inorganic layer INL1 is located in the first peripheral region NAA-1, and the edge ED-INL2 of the second inorganic layer INL2 is located in the second peripheral region NAA-2. For example, in a plan view, the edge ED-INL2 of the second inorganic layer INL2 is positioned outward from the edge ED-INL1 of the first inorganic layer INL1. However, embodiments of the inventive concept are not necessarily limited thereto.

Figure 13:
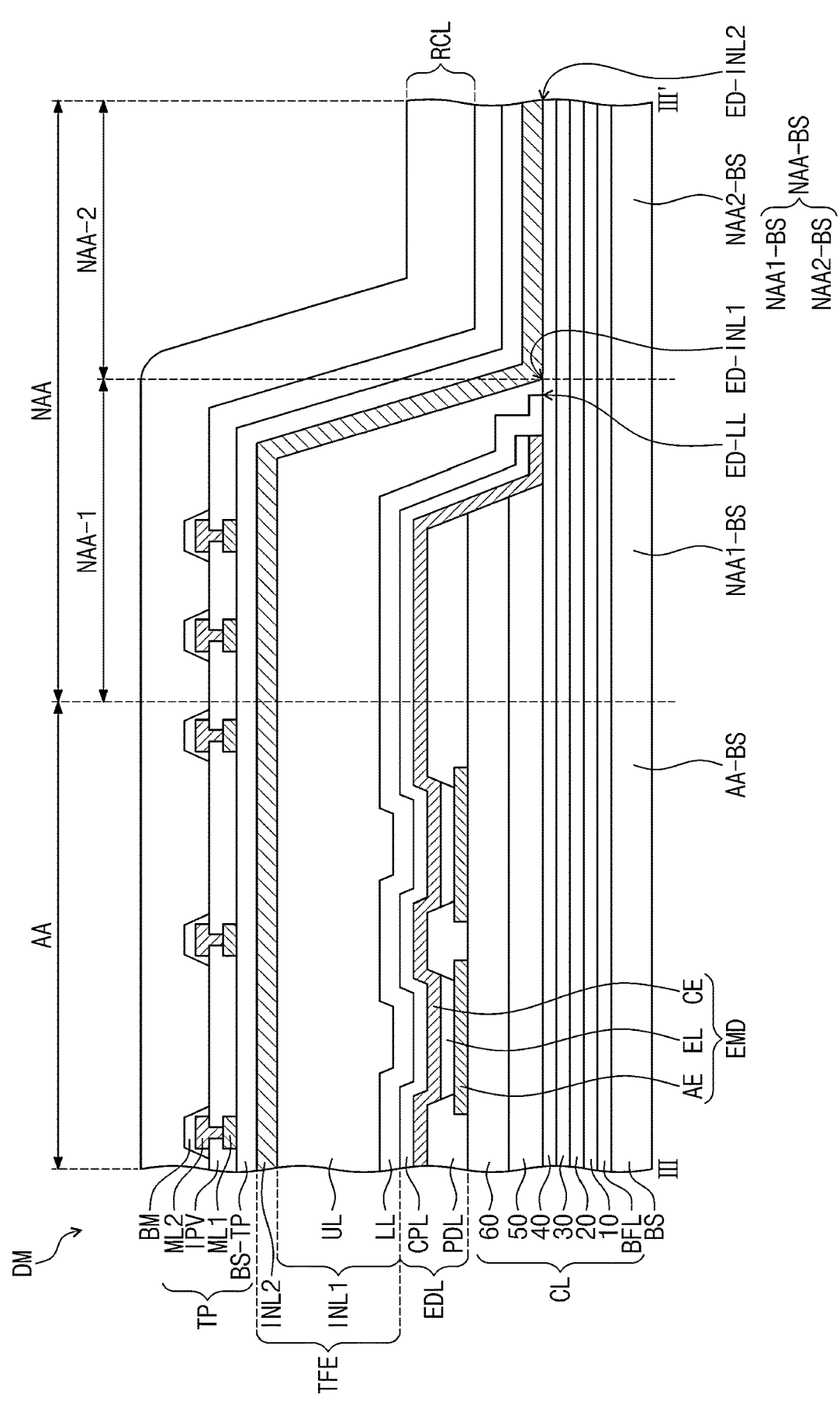
FIG. 13 is a cross-sectional view of a portion of a display module according to an embodiment of the inventive concept.

FIG. 13 is a cross-sectional view of a portion of the display module DM according to an embodiment of the inventive concept. FIG. 13 is a cross-sectional view along line III-III' of FIG. 12. FIG. 13 illustrates an embodiment that includes the encapsulation layer TFE that includes the first inorganic layer INL1 with the lower layer LL and the upper layer UL, and the second inorganic layer INL2.

Referring to FIG. 13, in an embodiment, an edge of the encapsulation layer TFE is located in the peripheral region NAA of the display module DM. For example, edge ED-LL of the lower layer LL of the first inorganic layer INL1 and the edge ED-INL1 of the first inorganic layer INL1 are located in the first peripheral region NAA-1, and the edge ED-INL2 of the second inorganic layer INL2 is located in the second peripheral region NAA-2. However, embodiments of the inventive concept are not necessarily limited thereto.

The base layer BS includes an active area AA-BS and a peripheral area NAA-BS. The active region AA-BS of the base layer BS corresponds to the active region AA of a display module, and the peripheral region NAA-BS of the base layer BS corresponds to the peripheral region NAA of the display module.

The base layer BS includes the active region AA-BS and the peripheral portion NAA-BS, and the peripheral region NAA-BS of the base layer BS includes a first peripheral portion NAA1-BS and a second peripheral portion NAA2-BS. The active region AA-BS of the base layer BS overlaps the light emitting element layer EDL. The peripheral portion NAA-BS of the base layer BS does not overlap the light emitting element layer EDL. In the peripheral region NAA-BS, the first peripheral portion NAA1-BS is adjacent to the active region AA-BS, and the second peripheral portion NAA2-BS is spaced apart from the active region AA-BS with the first peripheral portion NAA1-BS interposed therebetween.

The first peripheral portion NAA1-BS of the base layer BS overlaps the first inorganic layer INL1 and the second inorganic layer INL2. The second peripheral portion NAA2-BS of the base layer BS does not overlap the first inorganic layer INL1, but overlaps the second inorganic layer INL2.

However, in an embodiment, unlike that illustrated in FIG. 13, the edge ED-LL of the lower layer LL of the first inorganic layer INL1 overlaps an edge of the upper layer UL, that is, the edge ED-INL1 of the first inorganic layer INL1. For example, the lower layer LL and the upper layer UL are continuously deposited in the same chamber, and are simultaneously patterned using one mask.

The circuit layer CL is disposed on the base layer BS. The circuit layer CL overlaps the active region AA and the peripheral region NAA. The portions of circuit layer CL that overlap the peripheral region NAA may lack some of the components of the portions of the circuit layer CL that overlap the active region AA. For example, compared to the active region AA, in the second peripheral region NAA-2, the fifth and sixth insulation layers 50 and 60 are removed, and the circuit layer CL includes the first to fourth insulation layers 10, 20, 30 and 40. However, embodiments of the inventive concept are not necessarily limited thereto.

The second inorganic layer INL2 is directly disposed on the uppermost layer of the insulation layers 10, 20, 30, and 40 that extend into the second peripheral portion NAA2-BS.

Embodiments of inventive concept do not include a separate organic layer for planarization, unlike a typical encapsulation layer, so that a dam introduced to control the flow of the organic layer is omitted. For example, the display module DM of an embodiment has a structure in which the fifth insulation layer 50, the sixth insulation layer 60, and the pixel definition film PDL are formed in the same process, and a dam that protrudes from the insulation layers 10, 20, 30, and 40 in the peripheral region NAA is omitted.

Figure 14:
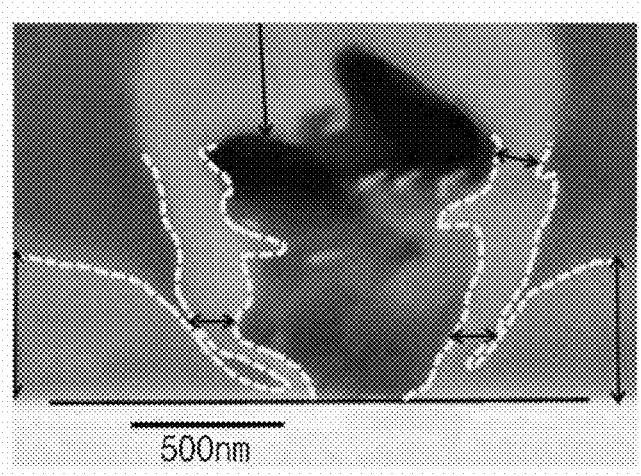
FIG. 14 is a cross-sectional TEM image of a test sample of a barrier layer according to an embodiment of the inventive concept.
Figure 15:
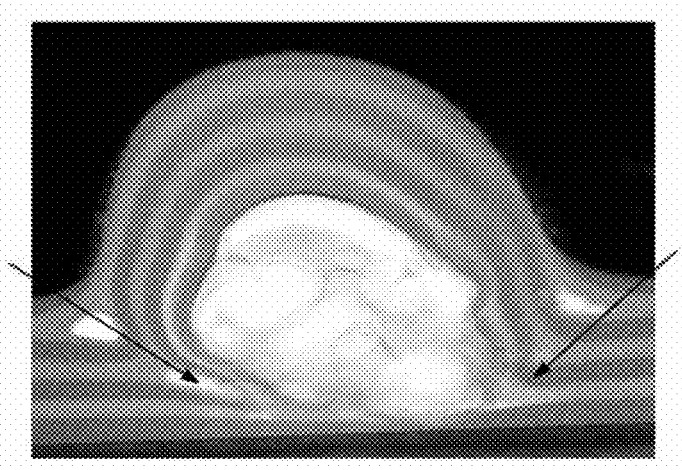
FIG. 15 is a cross-sectional TEM image of a test sample of a laminated film on which a barrier layer and a planarization layer according to an embodiment of the inventive concept are laminated.

FIG. 14 is a cross-sectional TEM image of a test sample of a barrier layer according to an embodiment of the inventive concept. FIG. 15 is a cross-sectional TEM image of a test sample of a laminated film on which a barrier layer and a planarization layer according to an embodiment of the inventive concept are laminated.

FIG. 14 is a TEM image of a cross-section of a sample for testing particle coverage properties of a barrier layer according to an embodiment of the inventive concept. In FIG. 14, a barrier layer has been deposited on a particle to a thickness of approximately 800 nm.

Referring to FIG. 14, unevenness due to a particle on an Si substrate is planarized by the barrier layer. Barrier properties of the barrier layer of FIG. 14 will be described in detail in Table 2 below.

FIG. 15 is a TEM image of a cross-section of a sample for testing particle coverage properties of a structure in which a barrier layer and a planarization layer according to an embodiment of the inventive concept are alternately laminated. FIG. 15 shows a structure, a 7-layered laminated film, in which a barrier film and a planarization layer are alternately laminated on a particle. In the 7-layered laminated film, the lowermost layer and the uppermost layer are barrier layers. The thickness of each of the seven layers in the 7-layered laminated film is approximately 20 nm to approximately 70 nm, and the total thickness of the 7-layered laminated film is approximately 500 nm. The composition ratio of each layer of the sample of FIG. 15 is as shown in Table 1 below.

In Table 1, the layer composition ratio is distinguished by silicon, oxygen, and others, such as carbon and fluorine.

TABLE 1

| 7-layered laminated film composition ratio (at %) TEM EDS | | | | | |
|---|---|---|---|---|---|
| | | Layer composition ratio (at %) | | | |
| Layer number | Layer type | Si | O | C | Others (F) |
| layer 7 | barrier layer | 37 | 63 | 0 | 0 |
| layer 6 | planarization layer | 28 | 58 | 13 | 0 |
| layer 5 | Barrier layer | 34 | 66 | 0 | 0 |
| layer 4 | Planarization layer | 27 | 60 | 13 | 0 |
| layer 3 | barrier layer | 33 | 67 | 0 | 0 |
| layer 2 | planarization layer | 28 | 59 | 8 | 4 |
| layer 1 | barrier layer | 29 | 62 | 5 | 3 |

The table shows that when a barrier layer and a planarization layer are alternately laminated with a small thickness as shown in FIG. 15, planarization properties are further increased. In addition, referring to a lower region of a particle marked with an arrow in FIG. 15, the barrier layer and the planarization layer are deposited to a uniform thickness without leaving an empty space. Accordingly, a structure in which a barrier layer and a planarization layer are alternately laminated has particle coverage properties.

Referring to FIG. 14 and FIG. 15 together, an encapsulation layer of an embodiment of the present disclosure has barrier properties since a lower layer thereof includes at least one barrier layer. In addition, the encapsulation layer of an embodiment of the present disclosure has increased particle coverage properties since the lower layer thereof includes a structure in which a barrier layer and a planarization layer are alternately laminated.

The planarization layer of FIG. 15, which includes a silicon oxycarbide, shows planarization properties, and an upper layer of an embodiment of the present disclosure that also includes a silicon oxycarbide has planarization properties.

To evaluate barrier properties of an encapsulation layer of an embodiment of the present disclosure, Table 2 shows results of a water vapor transmission rate (WVTR) test. The type and water vapor transmission rate of each test sample are as shown in Table 2 below.

In Table 2, below, a PEN film is a film containing polyethylene naphthalate.

In Table 2 below, a barrier layer is described above with respect to FIG. 14, and a 7-layered laminated film is described above with respect to FIG. 15.

TABLE 2

| Classifications | Structure | WVTR (g/m²/day) | Barrier properties |
|---|---|---|---|
| Example 1 | Structure in which barrier layer is disposed on PEN film | $4.8 \times 10^{-2}$ | Yes |
| Example 2 | Structure in which 7-layered laminated film is disposed on PEN film | $1.8 \times 10^{-2}$ | Yes |
| Comparative Example 1 | Structure in which PEN film is disposed | $1.4 \times 10$ | No |
| Comparative Example 2 | Structure in which planarization layer is disposed on PEN film | $1.4 \times 10$ | No |

Referring to Table 2, Example 1 and Example 2 have increased barrier properties compared to Comparative Example 1 and Comparative Example 2. In addition, when a barrier layer and a planarization layer are laminated in Example 2, a WVTR value is further decreased, and the barrier properties are further increased.

Referring to Comparative Example 1 and Comparative Example 2, even when a planarization layer is disposed on a PEN film, a WVTR value does not change. For example, when only a planarization layer is disposed without a barrier layer, there are no barrier properties.

An encapsulation layer of an embodiment of the present disclosure has barrier properties since a lower layer thereof includes at least one barrier layer and protects a light emitting element layer from external moisture and oxygen. In addition, an encapsulation layer of an embodiment of the present disclosure has planarization properties and further increased barrier properties when a lower layer thereof has a structure in which a barrier layer and a planarization layer are laminated.

An encapsulation layer of an embodiment of the present disclosure does not include a planarizing organic layer, but includes a first inorganic layer and a second inorganic layer that includes a lower layer and an upper layer, and thus, has barrier properties and planarization properties.

When manufacturing an encapsulation layer of an embodiment of the present disclosure, there is no need for a printing process, etc., such as an ink jet that forms an organic layer, which simplifies equipment, reduces manufacturing time, and increases a processability of the encapsulation layer. For example, the encapsulation layer of the present disclosure can be deposited only by chemical vapor deposition (CVD).

A display panel of an embodiment of the present disclosure includes an encapsulation layer with barrier and planarization properties, which increases a reliability of the display panel.

A first inorganic layer in an encapsulation layer of a display panel of an embodiment includes a barrier layer that contains a silicon oxide and a planarization layer that contains a silicon oxycarbide, thereby simultaneously providing barrier properties and planarization properties.

In addition, an encapsulation layer included in a display panel of an embodiment includes inorganic layers, and thus, can be formed by chemical vapor deposition (CVD). Accordingly, compared to a process that forms an encapsulation layer that includes an organic layer, the processibility of the encapsulation layer of the present disclosure is increased.

What is claimed is:

1. A display panel, comprising:
a base layer;
a circuit layer disposed on the base layer;
a light emitting element layer disposed on the circuit layer; and
an encapsulation layer disposed on the light emitting element layer, wherein the encapsulation layer includes a first inorganic layer that includes a lower layer and an upper layer disposed on the lower layer, and a second inorganic layer disposed on the first inorganic layer,
wherein the lower layer includes a barrier layer that includes a silicon oxide,
the upper layer includes a silicon oxycarbide, and
wherein in the upper layer, based on a total content,
a content of silicon is 20 at % or more and 40 at % or less,
a content of oxygen is 50 at % or more and 70 at % or less, and
a content of carbon is greater than 0 at % and 30 at % or less.

2. The display panel of claim 1, wherein:
the lower layer further comprises a planarization layer that includes a silicon oxycarbide;
the lower layer comprises a laminate structure of two or more layers in which the barrier layer and the planarization layer are alternately laminated; and
the upper layer is in contact with a barrier layer.

3. The display panel of claim 2, wherein in the planarization layer, based on a total content,
a content of silicon is 20 at % or more and 40 at % or less,
a content of oxygen is 50 at % or more and 70 at % or less, and
a content of carbon is greater than 0 at % and 30 at % or less.

4. The display panel of claim 3, wherein in the planarization layer, based on the total content, the content of carbon is greater than 0 at % and 15 at % or less.

5. The display panel of claim 2, wherein a thickness of the barrier layer is 10 nm or more and 500 nm or less, and a thickness of the planarization layer is 10 nm or more and 1 μm or less.

6. The display panel of claim 1, wherein a thickness of the lower layer is 10 nm or more and 2 μm or less.

7. The display panel of claim 1, wherein the upper layer has a single-layered structure.

8. The display panel of claim 1, wherein in the upper layer, based on the total content, the content of carbon is greater than 0 at % and 15 at % or less.

9. The display panel of claim 1, wherein a thickness of the upper layer is 3 μm or more and 10 μm or less.

10. The display panel of claim 1, wherein:
the light emitting element layer comprises a pixel definition film and a light emitting element that includes a functional layer disposed in an opening formed in the pixel definition film; and
the first inorganic layer covers the light emitting element.

11. A display panel, comprising:
a base layer;
a circuit layer disposed on the base layer;
a light emitting element layer disposed on the circuit layer; and
an encapsulation layer disposed on the light emitting element layer, wherein the encapsulation layer includes a first inorganic layer and a second inorganic layer disposed on the first inorganic layer,
wherein the first inorganic layer includes a laminate structure of two or more layers in which a barrier layer that includes a silicon oxide and a planarization layer that includes a silicon oxycarbide are alternately laminated,
an uppermost layer of the first inorganic layer is a planarization layer, and
wherein in the planarization layer, based on a total content,
a content of silicon is 20 at % or more and 40 at % or less,
a content of oxygen is 50 at % or more and 70 at % or less, and
a content of carbon is greater than 0 at % and 30 at % or less.

12. The display panel of claim 11, wherein a thickness of the uppermost layer of the first inorganic layer is 3 μm or more and 10 μm or less.

13. The display panel of claim 11, wherein in the first inorganic layer, a sum of thicknesses of layers other than the uppermost layer is 10 nm or more and 2 μm or less.

14. An electronic device, comprising:
a display panel, wherein the display panel comprises:
a base layer;
a circuit layer disposed on the base layer;
a light emitting element layer disposed on the circuit layer; and
an encapsulation layer disposed on the light emitting element layer, wherein the encapsulation layer includes a first inorganic layer and a second inorganic layer disposed on the first inorganic layer,
wherein the first inorganic layer includes a laminate structure of two or more layers in which at least one barrier layer and at least one planarization layer are alternately laminated,
the at least one barrier layer includes silicon and oxygen,
the at least one planarization layer includes silicon, oxygen, and carbon, and
wherein in the at least one planarization layer, based on a total content,
a content of silicon is 20 at % or more and 40 at % or less,
a content of oxygen is 50 at % or more and 70 at % or less, and
a content of carbon is greater than 0 at % and 30 at % or less.

15. The electronic device of claim 14, wherein:
the at least one barrier layer comprises a first barrier layer to an m-th barrier layer,
the at least one planarization layer comprises a first planarization layer to an n-th planarization layer,
m and n are each independently an integer of 2 or greater,
the first barrier layer to the m-th barrier layer are alternately laminated with the first planarization layer to the n-th planarization layer, and
the second inorganic layer is in contact with the first planarization layer.

16. The electronic device of claim 15, wherein the first planarization layer has a thickness greater than a thickness of each of the first planarization layer to the n-th planarization layer.

17. The electronic device of claim 15, wherein
a composition ratio of any one of the first barrier layer to the m-th barrier layer differs from the composition ratio of at least another barrier layer, and a composition ratio of any one of the first planarization layer to the n-th planarization layer differs from the composition ratio of at least another planarization layer.

\* \* \* \* \*